(12) United States Patent
Aldaz et al.

(10) Patent No.: US 9,000,466 B1
(45) Date of Patent: Apr. 7, 2015

(54) METHODS AND DEVICES FOR LIGHT EXTRACTION FROM A GROUP III-NITRIDE VOLUMETRIC LED USING SURFACE AND SIDEWALL ROUGHENING

(71) Applicant: Soraa, Inc., Fremont, CA (US)

(72) Inventors: Rafael Aldaz, Fremont, CA (US);
Aurelien David, Fremont, CA (US);
Daniel F. Feezell, Fremont, CA (US);
Thomas M. Katona, Fremont, CA (US);
Rajat Sharma, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 13/781,633

(22) Filed: Feb. 28, 2013

Related U.S. Application Data

(63) Continuation-in-part of application No. 12/861,765, filed on Aug. 23, 2010, now abandoned.

(60) Provisional application No. 61/605,026, filed on Feb. 29, 2012.

(51) Int. Cl.
| | | |
|---|---|---|
| *H01L 33/22* | (2010.01) | |
| *H01L 33/20* | (2010.01) | |
| *H01L 33/58* | (2010.01) | |
| *H01L 33/00* | (2010.01) | |
| *H01L 33/32* | (2010.01) | |
| *H01L 33/48* | (2010.01) | |

(52) U.S. Cl.
CPC ............ *H01L 33/58* (2013.01); *H01L 33/0025* (2013.01); *H01L 33/32* (2013.01); *H01L 33/48* (2013.01)

(58) Field of Classification Search
CPC .............................. H01L 33/22; H01L 33/20
USPC ...................................... 257/98, 94, E33.001
See application file for complete search history.

(56) References Cited

U.S. PATENT DOCUMENTS

| | | |
|---|---|---|
| 4,065,688 A | 12/1977 | Thornton |
| 4,066,868 A | 1/1978 | Witkin et al. |
| 4,350,560 A | 9/1982 | Helgeland et al. |
| 4,581,646 A | 4/1986 | Kubodera |
| 4,870,045 A | 9/1989 | Gasper et al. |

(Continued)

FOREIGN PATENT DOCUMENTS

| | | |
|---|---|---|
| EP | 2381490 | 10/2011 |
| JP | 06-334215 | 12/1994 |

(Continued)

OTHER PUBLICATIONS

Weaver et al., 'Optical Properties of Selected Elements', Handbook of Chemistry and Physics, 94th Edition, 2013-2014, p. 12-126-12-150.

(Continued)

*Primary Examiner* — Marc Armand
(74) *Attorney, Agent, or Firm* — Kilpatrick Townsend & Stockton LLP

(57) ABSTRACT

Embodiments of the present disclosures are directed to improved approaches for achieving high-performance light extraction from a Group III-nitride volumetric LED chips. More particularly, disclosed herein are techniques for achieving high-performance light extraction from a Group III-nitride volumetric LED chip using surface and sidewall roughening.

25 Claims, 24 Drawing Sheets

(56) References Cited

U.S. PATENT DOCUMENTS

| | | | |
|---|---|---|---|
| 5,142,387 A | 8/1992 | Shikama et al. |
| 5,169,486 A | 12/1992 | Young et al. |
| 5,331,654 A | 7/1994 | Jewell et al. |
| 5,607,899 A | 3/1997 | Yoshida et al. |
| 5,632,812 A | 5/1997 | Hirabayashi |
| 5,764,674 A | 6/1998 | Hibbs-Brenner et al. |
| 5,813,753 A | 9/1998 | Vriens et al. |
| 6,275,145 B1 | 8/2001 | Rogozinski |
| 6,335,771 B1 | 1/2002 | Hiraishi |
| 6,498,355 B1 | 12/2002 | Harrah et al. |
| 6,501,154 B2 | 12/2002 | Morita et al. |
| 6,509,651 B1 | 1/2003 | Matsubara et al. |
| 6,533,874 B1 | 3/2003 | Vaudo et al. |
| 6,547,249 B2 | 4/2003 | Collins, III et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,809,781 B2 | 10/2004 | Setlur et al. |
| 6,853,010 B2 | 2/2005 | Slater, Jr. et al. |
| 6,858,882 B2 | 2/2005 | Tsuda et al. |
| 6,860,628 B2 | 3/2005 | Robertson et al. |
| 6,864,641 B2 | 3/2005 | Dygert |
| 6,936,488 B2 | 8/2005 | D'Evelyn et al. |
| 6,956,246 B1 | 10/2005 | Epler et al. |
| 6,989,807 B2 | 1/2006 | Chiang |
| 7,009,199 B2 | 3/2006 | Hall |
| 7,012,279 B2 | 3/2006 | Wierer, Jr. et al. |
| 7,081,722 B1 | 7/2006 | Huynh et al. |
| 7,083,302 B2 | 8/2006 | Chen et al. |
| 7,113,658 B2 | 9/2006 | Ide et al. |
| 7,128,849 B2 | 10/2006 | Setlur et al. |
| 7,253,446 B2 | 8/2007 | Sakuma et al. |
| 7,279,040 B1 | 10/2007 | Wang |
| 7,285,801 B2 | 10/2007 | Eliashevich et al. |
| 7,303,630 B2 | 12/2007 | Motoki et al. |
| 7,318,651 B2 | 1/2008 | Chua et al. |
| 7,341,880 B2 | 3/2008 | Erchak et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,419,281 B2 | 9/2008 | Porchia et al. |
| 7,470,938 B2 | 12/2008 | Lee et al. |
| 7,483,466 B2 | 1/2009 | Uchida et al. |
| 7,489,441 B2 | 2/2009 | Scheible et al. |
| 7,560,981 B2 | 7/2009 | Chao et al. |
| 7,622,742 B2 | 11/2009 | Kim et al. |
| 7,733,571 B1 | 6/2010 | Li |
| 7,816,238 B2 | 10/2010 | Osada et al. |
| 7,858,408 B2 | 12/2010 | Mueller et al. |
| 7,862,761 B2 | 1/2011 | Okushima et al. |
| 7,871,839 B2 | 1/2011 | Lee et al. |
| 7,884,538 B2 | 2/2011 | Mitsuishi et al. |
| 7,906,793 B2 | 3/2011 | Negley |
| 7,923,741 B1 | 4/2011 | Zhai et al. |
| 8,044,412 B2 | 10/2011 | Murphy et al. |
| 8,044,609 B2 | 10/2011 | Liu |
| 8,062,726 B2 | 11/2011 | Greiner et al. |
| 8,142,566 B2 | 3/2012 | Kiyomi et al. |
| 8,188,504 B2 | 5/2012 | Lee |
| 8,198,643 B2 | 6/2012 | Lee et al. |
| 8,207,548 B2 | 6/2012 | Nagai |
| 8,207,554 B2 | 6/2012 | Shum |
| 8,247,886 B1 | 8/2012 | Sharma et al. |
| 8,247,887 B1 | 8/2012 | Raring et al. |
| 8,252,662 B1 | 8/2012 | Poblenz et al. |
| 8,269,245 B1 | 9/2012 | Shum |
| 8,293,551 B2 | 10/2012 | Sharma et al. |
| 8,310,143 B2 | 11/2012 | Van De Ven et al. |
| 8,314,429 B1 | 11/2012 | Raring et al. |
| 8,324,840 B2 | 12/2012 | Shteynberg et al. |
| 8,350,273 B2 | 1/2013 | Vielemeyer |
| 8,362,603 B2 | 1/2013 | Lim et al. |
| 8,404,071 B2 | 3/2013 | Cope et al. |
| 8,410,711 B2 | 4/2013 | Lin et al. |
| 8,410,717 B2 | 4/2013 | Shteynberg et al. |
| 8,431,942 B2 | 4/2013 | Butterworth |
| 8,455,894 B1 | 6/2013 | D'Evelyn et al. |
| 8,502,465 B2 | 8/2013 | Katona et al. |
| 8,519,437 B2 | 8/2013 | Chakraborty |
| 8,524,578 B1 | 9/2013 | Raring et al. |
| 8,541,951 B1 | 9/2013 | Shum et al. |
| 8,575,642 B1 | 11/2013 | Shum |
| 8,575,728 B1 | 11/2013 | Raring et al. |
| 8,674,395 B2 | 3/2014 | Shum |
| 8,704,258 B2 | 4/2014 | Tasaki et al. |
| 2001/0009134 A1 | 7/2001 | Kim et al. |
| 2001/0022495 A1 | 9/2001 | Salam |
| 2001/0043042 A1 | 11/2001 | Murazaki et al. |
| 2001/0048114 A1 | 12/2001 | Morita et al. |
| 2001/0055208 A1 | 12/2001 | Kimura |
| 2002/0070416 A1 | 6/2002 | Morse et al. |
| 2002/0088985 A1 | 7/2002 | Komoto et al. |
| 2002/0096994 A1 | 7/2002 | Iwafuchi et al. |
| 2002/0105986 A1 | 8/2002 | Yamasaki |
| 2002/0155691 A1 | 10/2002 | Lee et al. |
| 2002/0182768 A1 | 12/2002 | Morse et al. |
| 2003/0000453 A1 | 1/2003 | Unno et al. |
| 2003/0001238 A1 | 1/2003 | Ban |
| 2003/0020087 A1 | 1/2003 | Goto et al. |
| 2003/0047076 A1 | 3/2003 | Liu |
| 2003/0164507 A1 | 9/2003 | Edmond et al. |
| 2004/0070004 A1* | 4/2004 | Eliashevich et al. .......... 257/200 |
| 2004/0080256 A1 | 4/2004 | Hampden-Smith et al. |
| 2004/0104391 A1 | 6/2004 | Maeda et al. |
| 2004/0116033 A1 | 6/2004 | Ouderkirk et al. |
| 2004/0124435 A1 | 7/2004 | D'Evelyn et al. |
| 2004/0161222 A1 | 8/2004 | Niida et al. |
| 2004/0190304 A1 | 9/2004 | Sugimoto et al. |
| 2004/0201598 A1 | 10/2004 | Eliav et al. |
| 2004/0207998 A1 | 10/2004 | Suehiro et al. |
| 2004/0227149 A1 | 11/2004 | Ibbetson et al. |
| 2004/0251471 A1 | 12/2004 | Dwilinski et al. |
| 2005/0084218 A1 | 4/2005 | Ide et al. |
| 2005/0087753 A1 | 4/2005 | D'Evelyn et al. |
| 2005/0121679 A1 | 6/2005 | Nagahama et al. |
| 2005/0167680 A1 | 8/2005 | Shei et al. |
| 2005/0179376 A1 | 8/2005 | Fung et al. |
| 2005/0199899 A1 | 9/2005 | Lin et al. |
| 2005/0214992 A1 | 9/2005 | Chakraborty et al. |
| 2005/0224830 A1 | 10/2005 | Blonder et al. |
| 2005/0232327 A1 | 10/2005 | Nomura et al. |
| 2005/0263791 A1 | 12/2005 | Yanagihara et al. |
| 2006/0006404 A1 | 1/2006 | Ibbetson et al. |
| 2006/0038542 A1 | 2/2006 | Park et al. |
| 2006/0060131 A1 | 3/2006 | Atanackovic |
| 2006/0060872 A1 | 3/2006 | Edmond et al. |
| 2006/0068154 A1 | 3/2006 | Parce et al. |
| 2006/0079082 A1 | 4/2006 | Bruhns et al. |
| 2006/0097385 A1 | 5/2006 | Negley |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0166390 A1 | 7/2006 | Letertre et al. |
| 2006/0169993 A1 | 8/2006 | Fan et al. |
| 2006/0177362 A1 | 8/2006 | D'Evelyn et al. |
| 2006/0180828 A1 | 8/2006 | Kim et al. |
| 2006/0189098 A1 | 8/2006 | Edmond |
| 2006/0204865 A1 | 9/2006 | Erchak et al. |
| 2006/0205199 A1 | 9/2006 | Baker et al. |
| 2006/0208262 A1 | 9/2006 | Sakuma et al. |
| 2006/0213429 A1 | 9/2006 | Motoki et al. |
| 2006/0214287 A1 | 9/2006 | Ogihara et al. |
| 2006/0255343 A1 | 11/2006 | Ogihara et al. |
| 2006/0261364 A1 | 11/2006 | Suehiro et al. |
| 2006/0273339 A1 | 12/2006 | Steigerwald et al. |
| 2006/0288927 A1 | 12/2006 | Chodelka et al. |
| 2007/0045200 A1 | 3/2007 | Moon et al. |
| 2007/0054476 A1 | 3/2007 | Nakahata et al. |
| 2007/0072324 A1 | 3/2007 | Krames et al. |
| 2007/0093073 A1 | 4/2007 | Farrell, Jr. et al. |
| 2007/0096239 A1 | 5/2007 | Cao et al. |
| 2007/0105351 A1 | 5/2007 | Motoki et al. |
| 2007/0114563 A1 | 5/2007 | Paek et al. |
| 2007/0114569 A1 | 5/2007 | Wu et al. |

(56) References Cited

U.S. PATENT DOCUMENTS

| | | |
|---|---|---|
| 2007/0121690 A1 | 5/2007 | Fujii et al. |
| 2007/0126023 A1 | 6/2007 | Haskell et al. |
| 2007/0131967 A1 | 6/2007 | Kawaguchi et al. |
| 2007/0170450 A1 | 7/2007 | Murphy |
| 2007/0181895 A1 | 8/2007 | Nagai |
| 2007/0202624 A1* | 8/2007 | Yoon et al. ............... 438/29 |
| 2007/0231963 A1 | 10/2007 | Doan et al. |
| 2007/0231978 A1 | 10/2007 | Kanamoto et al. |
| 2007/0264733 A1 | 11/2007 | Choi et al. |
| 2007/0280320 A1 | 12/2007 | Feezell et al. |
| 2007/0290224 A1 | 12/2007 | Ogawa |
| 2008/0023691 A1 | 1/2008 | Jang et al. |
| 2008/0030976 A1 | 2/2008 | Murazaki et al. |
| 2008/0054290 A1 | 3/2008 | Shieh et al. |
| 2008/0073660 A1 | 3/2008 | Ohno et al. |
| 2008/0083929 A1 | 4/2008 | Fan et al. |
| 2008/0087919 A1 | 4/2008 | Tysoe et al. |
| 2008/0099777 A1 | 5/2008 | Erchak et al. |
| 2008/0106212 A1 | 5/2008 | Yen et al. |
| 2008/0121906 A1 | 5/2008 | Yakushiji |
| 2008/0121913 A1 | 5/2008 | McKenzie et al. |
| 2008/0128752 A1 | 6/2008 | Wu |
| 2008/0142781 A1 | 6/2008 | Lee |
| 2008/0151543 A1 | 6/2008 | Wang |
| 2008/0164489 A1 | 7/2008 | Schmidt et al. |
| 2008/0164578 A1 | 7/2008 | Tanikella et al. |
| 2008/0173884 A1 | 7/2008 | Chitnis et al. |
| 2008/0179610 A1 | 7/2008 | Okamoto et al. |
| 2008/0192791 A1 | 8/2008 | Furukawa et al. |
| 2008/0194054 A1 | 8/2008 | Lin et al. |
| 2008/0198881 A1 | 8/2008 | Farrell et al. |
| 2008/0206925 A1 | 8/2008 | Chatterjee et al. |
| 2008/0210958 A1 | 9/2008 | Senda et al. |
| 2008/0211416 A1 | 9/2008 | Negley et al. |
| 2008/0217745 A1 | 9/2008 | Miyanaga et al. |
| 2008/0230765 A1 | 9/2008 | Yoon et al. |
| 2008/0237569 A1 | 10/2008 | Nago et al. |
| 2008/0272463 A1 | 11/2008 | Butcher et al. |
| 2008/0282978 A1 | 11/2008 | Butcher et al. |
| 2008/0283851 A1 | 11/2008 | Akita |
| 2008/0284346 A1 | 11/2008 | Lee |
| 2008/0285609 A1 | 11/2008 | Ohta et al. |
| 2008/0298409 A1 | 12/2008 | Yamashita et al. |
| 2008/0303033 A1 | 12/2008 | Brandes |
| 2009/0032828 A1 | 2/2009 | Romano et al. |
| 2009/0065798 A1 | 3/2009 | Masui et al. |
| 2009/0071394 A1 | 3/2009 | Nakahata et al. |
| 2009/0072252 A1 | 3/2009 | Son et al. |
| 2009/0078955 A1 | 3/2009 | Fan et al. |
| 2009/0081857 A1 | 3/2009 | Hanser et al. |
| 2009/0086475 A1 | 4/2009 | Caruso et al. |
| 2009/0095973 A1 | 4/2009 | Tanaka et al. |
| 2009/0140279 A1 | 6/2009 | Zimmerman et al. |
| 2009/0146170 A1 | 6/2009 | Zhong et al. |
| 2009/0173958 A1 | 7/2009 | Chakraborty et al. |
| 2009/0194796 A1 | 8/2009 | Hashimoto et al. |
| 2009/0227056 A1 | 9/2009 | Kyono et al. |
| 2009/0250686 A1 | 10/2009 | Sato et al. |
| 2009/0252191 A1 | 10/2009 | Kubota et al. |
| 2009/0262516 A1 | 10/2009 | Li |
| 2009/0267098 A1 | 10/2009 | Choi |
| 2009/0273005 A1 | 11/2009 | Lin |
| 2009/0309110 A1 | 12/2009 | Raring et al. |
| 2009/0315480 A1 | 12/2009 | Yan et al. |
| 2009/0321778 A1 | 12/2009 | Chen et al. |
| 2010/0001300 A1 | 1/2010 | Raring et al. |
| 2010/0006873 A1 | 1/2010 | Raring et al. |
| 2010/0025656 A1 | 2/2010 | Raring et al. |
| 2010/0032691 A1 | 2/2010 | Kim |
| 2010/0108985 A1 | 5/2010 | Chung et al. |
| 2010/0109030 A1 | 5/2010 | Krames et al. |
| 2010/0117101 A1 | 5/2010 | Kim et al. |
| 2010/0117106 A1 | 5/2010 | Trottier |
| 2010/0117118 A1 | 5/2010 | Dabiran et al. |
| 2010/0148145 A1 | 6/2010 | Ishibashi et al. |
| 2010/0148210 A1 | 6/2010 | Huang et al. |
| 2010/0149814 A1 | 6/2010 | Zhai et al. |
| 2010/0155746 A1 | 6/2010 | Ibbetson et al. |
| 2010/0164403 A1 | 7/2010 | Liu |
| 2010/0195687 A1 | 8/2010 | Okamoto et al. |
| 2010/0200888 A1 | 8/2010 | Kuhmann et al. |
| 2010/0219505 A1 | 9/2010 | D'Evelyn |
| 2010/0220262 A1 | 9/2010 | Demille et al. |
| 2010/0240158 A1 | 9/2010 | Ter-Hovhannissian |
| 2010/0244055 A1 | 9/2010 | Greisen |
| 2010/0258830 A1 | 10/2010 | Ide et al. |
| 2010/0290208 A1 | 11/2010 | Pickard |
| 2010/0295088 A1 | 11/2010 | D'Evelyn et al. |
| 2010/0309943 A1 | 12/2010 | Chakraborty et al. |
| 2011/0001157 A1 | 1/2011 | McKenzie et al. |
| 2011/0017298 A1 | 1/2011 | Lee |
| 2011/0038154 A1 | 2/2011 | Chakravarty et al. |
| 2011/0056429 A1 | 3/2011 | Raring et al. |
| 2011/0057205 A1 | 3/2011 | Mueller et al. |
| 2011/0062415 A1 | 3/2011 | Ohta et al. |
| 2011/0064103 A1 | 3/2011 | Ohta et al. |
| 2011/0068700 A1 | 3/2011 | Fan |
| 2011/0075694 A1 | 3/2011 | Yoshizumi et al. |
| 2011/0101350 A1 | 5/2011 | Greisen |
| 2011/0101400 A1 | 5/2011 | Chu et al. |
| 2011/0101414 A1 | 5/2011 | Thompson et al. |
| 2011/0108081 A1 | 5/2011 | Werthen et al. |
| 2011/0124139 A1 | 5/2011 | Chang |
| 2011/0175200 A1 | 7/2011 | Yoshida |
| 2011/0180781 A1 | 7/2011 | Raring et al. |
| 2011/0182056 A1 | 7/2011 | Trottier et al. |
| 2011/0186860 A1 | 8/2011 | Enya et al. |
| 2011/0186874 A1 | 8/2011 | Shum |
| 2011/0216795 A1 | 9/2011 | Hsu et al. |
| 2011/0266552 A1 | 11/2011 | Tu et al. |
| 2011/0279054 A1 | 11/2011 | Katona et al. |
| 2011/0279998 A1 | 11/2011 | Su et al. |
| 2011/0315999 A1 | 12/2011 | Sharma et al. |
| 2011/0317397 A1 | 12/2011 | Trottier et al. |
| 2012/0007102 A1 | 1/2012 | Feezell et al. |
| 2012/0091465 A1 | 4/2012 | Krames et al. |
| 2012/0104412 A1 | 5/2012 | Zhong et al. |
| 2012/0135553 A1 | 5/2012 | Felker et al. |
| 2012/0187412 A1 | 7/2012 | D'Evelyn et al. |
| 2012/0199841 A1 | 8/2012 | Batres et al. |
| 2012/0235201 A1 | 9/2012 | Shum |
| 2012/0288974 A1 | 11/2012 | Sharma et al. |
| 2012/0299492 A1 | 11/2012 | Egawa et al. |
| 2012/0313541 A1 | 12/2012 | Egawa et al. |
| 2013/0022758 A1 | 1/2013 | Trottier |
| 2013/0026483 A1 | 1/2013 | Sharma et al. |
| 2013/0043799 A1 | 2/2013 | Siu et al. |
| 2013/0112987 A1 | 5/2013 | Fu et al. |
| 2013/0126902 A1 | 5/2013 | Isozaki et al. |
| 2013/0207148 A1 | 8/2013 | Krauter et al. |
| 2013/0234108 A1 | 9/2013 | David et al. |
| 2013/0313516 A1 | 11/2013 | David et al. |
| 2013/0322089 A1 | 12/2013 | Martis et al. |
| 2014/0042918 A1 | 2/2014 | Lee |
| 2014/0070710 A1 | 3/2014 | Harris |
| 2014/0103356 A1 | 4/2014 | Krames et al. |
| 2014/0145235 A1 | 5/2014 | Shum |
| 2014/0175492 A1 | 6/2014 | Steranka et al. |

FOREIGN PATENT DOCUMENTS

| | | |
|---|---|---|
| JP | 2006-147933 | 6/2006 |
| JP | 2007-110090 | 4/2007 |
| JP | 2008-084973 | 4/2008 |
| JP | 2008-172040 | 7/2008 |
| WO | WO 2006/062880 | 6/2006 |
| WO | WO 2009/001039 | 12/2008 |
| WO | WO 2009/066430 | 5/2009 |
| WO | WO 2010/150880 | 12/2010 |
| WO | WO 2011/010774 | 1/2011 |
| WO | WO 2012/022813 | 2/2012 |

(56) References Cited

FOREIGN PATENT DOCUMENTS

OTHER PUBLICATIONS

USPTO Office Action for U.S. Appl. No. 12/491,176 dated Nov. 22, 2013 (14 pages).
USPTO Office Action for U.S. Appl. No. 13/019,897 dated Dec. 2, 2013 (17 pages).
USPTO Office Action for U.S. Appl. No. 13/135,087 dated Sep. 27, 2013 (7 pages).
USPTO Office Action for U.S. Appl. No. 13/210,769 dated Oct. 28, 2013 (9 pages).
USPTO Office Action for U.S. Appl. No. 13/357,315 dated Oct. 15, 2013 (12 pages).
USPTO Notice of Allowance for U.S. Appl. No. 13/482,956 dated Oct. 28, 2013 (9 pages).
Csuti et al., 'Color-matching experiments with RGB-LEDs', Color Research and Application, vol. 33, No. 2, 2008, pp. 1-9.
Davis et al., 'Color Quality Scale', Optical Engineering 49(3), 2010, pp. 033602-1-033602-16.
Paper and Board Determination of CIE Whiteness, D65/10 (outdoor daylight), ISO International Standard 11475:2004E (2004), 18 pgs.
Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.
Whitehead et al., 'A Monte Carlo method for assessing color rendering quality with possible application to color rendering standards', Color Research and Application, vol. 37, No. 1, Feb. 2012, pp. 13-22.
USPTO Office Action for U.S. Appl. No. 12/491,176 dated Mar. 1, 2012.
USPTO Office Action for U.S. Appl. No. 12/491,176 dated Jul. 19, 2012.
USPTO Office Action for U.S. Appl. No. 12/914,789 dated Oct. 12, 2011.
USPTO Office Action for U.S. Appl. No. 12/914,789 dated Feb. 24, 2012.
USPTO Notice of Allowance for U.S. Appl. No. 12/914,789 dated May 17, 2012.
USPTO Office Action for U.S. Appl. No. 13/210,769 dated Apr. 4, 2013.
USPTO Notice of Allowance for U.S. Appl. No. 13/298,905 dated Jun. 11, 2013.
USPTO Office Action for U.S. Appl. No. 13/482,956 dated Aug. 17, 2012.
USPTO Office Action for U.S. Appl. No. 13/482,956 dated Feb. 14, 2013.
Benke et al., 'Uncertainty in Health Risks from Artificial Lighting due to Disruption of Circadian Rythm and Melatonin Secretion: A Review', Human and Ecological Risk Assessment: An International Journal, vol. 19, No. 4, 2013, pp. 916-929.
Hanifin et al., 'Photoreception for Circadian, Neuroendocrine, and Neurobehavioral Regulation', Journal of Physiological Anthropology, vol. 26, 2007, pp. 87-94.
Houser et al., 'Review of measures for light-source color rendition and considerations for a two-measure system for characterizing color rendition', Optics Express, vol. 21, No. 8, Apr. 19, 2013, pp. 10393-10411.
Rea et al., 'White Lighting', Color Research and Application, vol. 38, No. 2, Sep. 3, 2011, pp. 82-92.
USPTO Office Action for U.S. Appl. No. 13/482,956 dated Jul. 22, 2013, 17 pages.
USPTO Office Action for U.S. Appl. No. 13/600,988 dated Jul. 18, 2013, 13 pages.
USPTO Notice of Allowance for U.S. Appl. No. 13/600,988 dated Sep. 16, 2013, 9 pages.
Aguilar, 'Ohmic n-contacts to Gallium Nitride Light Emitting Diodes', National Nanotechnolghy Infrastructure Network, 2007, p. 56-81.
Baker et al., 'Characterization of Planar Semipolar Gallium Nitride Films on Spinel Substrates', Japanese Journal of Applied Physics, vol. 44, No. 29, 2005, p. L920-L922.
Cich et al., 'Bulk GaN based violet light-emitting diodes with high efficiency at very high current density', Applied Physics Letters, Nov. 29, 2012, p. 223509-1-223509-3.
Farrell et al., 'Continuous-Wave Operation of AlGaN-Cladding-Free Nonpolar m-Plane InGaN/GaN Laser Diodes', 2007, Japanese Journal of Applied Physics, vol. 46, No. 32, 2007, p. L761-L763.
Feezell et al., 'AlGaN-Cladding-Free Nonpolar InGaN/GaN Laser Diodes', Japanese Journal of Applied Physics, vol. 46, No. 13, 2007, p. L284-L286.
Founta et al., 'Anisotropic Morphology of Nonpolar a-Plane GaN Quantum Dots and Quantum Wells', Journal of Applied Physics, vol. 102, vol. 7, 2007, p. 074304-1-074304-6.
Haskell et al., 'Defect Reduction in (1100) m-plane gallium nitride via lateral epitaxial overgrowth by hydride vapor phase epitaxy', Applied Physics Letters 86, 111917 (2005), pp. 1-3.
Iso et al., 'High Brightness Blue InGaN/GaN Light Emitting Diode on Nonpolar m-Plane Bulk GaN Substrate', Japanese Journal of Applied Physics, vol. 46, No. 40, 2007, p. L960-L962.
Kim et al., 'High Brightness Light Emitting Diodes Using Dislocation-Free Indium Gallium Nitride/Gallium Nitride Multiquantum-Well Nanorod Arrays', Nano Letters, vol. 4, No. 6, 2004, p. 1059-1062.
Kojima et al., 'Stimulated Emission at 474 nm From an InGaN Laser Diode Structure Grown on a (1122) GaN Substrate', Applied Physics Letters, vol. 91, 2007, p. 251107-251107-3.
Kubota et al., 'Temperature Dependence of Polarized Photoluminescence From Nonpolar m-Plane InGaN Multiple Quantum Wells for Blue Laser Diodes', Applied Physics Letter, vol. 92, 2008, p. 011920-1-011920-3.
Lu et al., 'Etch-Pits of GaN Films with Different Etching Methods', Journal of the Korean Physical Society, vol. 45, Dec. 2004, p. S673-S675.
PCT Communication Including Partial Search and Examination Report for PCT/US2011/041106, dated Oct. 4, 2011, 4 pages total.
International Search Report of PCT Application No. PCT/US2011/041106, dated Jan. 5, 2012, 4 pages total.
International Search Report & Written Opinion of PCT Application No. PCT/US2013/029453, dated Jul. 25, 2013, 11 pages total.
http://www.philipslumileds.com/products/luxeon-flash, 'Luxeon Flash', Philips Lumileds, Aug. 8, 2013, pp. 1-2.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Sato et al., 'High Power and High Efficiency Semipolar InGaN Light Emitting Diodes', Journal of Light and Visible Environment, vol. 32, No. 2, Dec. 13, 2007, p. 57-60.
Selvanathan et al., 'Investigation of Surface Treatment Schemes on n-type GaN and Al 0.20Ga0.80N', Journal of Vacuum Science and Technology B, vol. 23, No. 6, May 10, 2005, p. 2538-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
Tsuda et al., 'Blue Laser Diodes Fabricated on m-Plane GaN Substrates', Applied Physics Express, vol. 1, 2008, p. 011104-1-011104-3.
Tyagi et al., 'Semipolar (1011) InGaN/GaN Laser Diodes on Bulk GaN Substrates', Japanese Journal of Applied Physics, vol. 46, No. 19, 2007, p. L444-L445.
Communication from the Korean Patent Office re 10-2012-7009980 dated Apr. 15, 2013, (6 pages).
Communication from the Japanese Patent Office re 2012-529969, dated Oct. 15, 2013, (6 pages).
USPTO Office Action for U.S. Appl. No. 12/478,736 dated Feb. 7, 2012 (6 pages).
USPTO Office Action for U.S. Appl. No. 12/481,543 dated Jun. 27, 2011 (9 pages).
USPTO Office Action for U.S. Appl. No. 12/491,169 dated Oct. 22, 2010 (9 pages).
USPTO Office Action for U.S. Appl. No. 12/491,169 dated May 11, 2011 (9 pages).
USPTO Office Action for U.S. Appl. No. 12/497,289 dated Feb. 2, 2012 (6 pages).

(56) References Cited

OTHER PUBLICATIONS

USPTO Notice of Allowance for U.S. Appl. No. 12/497,289 dated May 22, 2012 (7 pages).
USPTO Office Action for U.S. Appl. No. 12/569,841 dated Dec. 23, 2011 (12 pages).
USPTO Office Action for U.S. Appl. No. 12/569,841 dated Mar. 26, 2013 (17 pages).
USPTO Office Action for U.S. Appl. No. 12/569,841 dated Aug. 13, 2013 (20 pages).
USPTO Office Action for U.S. Appl. No. 12/569,844 dated Oct. 12, 2012 (12 pages).
USPTO Notice of Allowance for U.S. Appl. No. 12/569,844 dated Mar. 7, 2013 (9 pages).
USPTO Office Action for U.S. Appl. No. 12/634,665 dated Apr. 25, 2012 (9 pages).
USPTO Notice of Allowance for U.S. Appl. No. 12/720,593 dated Jul. 11, 2012 (7 pages).
USPTO Office Action for U.S. Appl. No. 12/749,466 dated Jul. 3, 2012 (18 pages).
USPTO Office Action for U.S. Appl. No. 12/749,476 dated Apr. 11, 2011 (14 pages).
USPTO Office Action for U.S. Appl. No. 12/749,476 dated Nov. 8, 2011 (11 pages).
USPTO Notice of Allowance for U.S. Appl. No. 12/749,476 dated May 4, 2012 (8 pages).
USPTO Notice of Allowance for U.S. Appl. No. 12/749,476 dated Jun. 26, 2012 (8 pages).
USPTO Office Action for U.S. Appl. No. 12/785,953 dated Apr. 12, 2012 (11 pages).
USPTO Office Action for U.S. Appl. No. 12/785,953 dated Jan. 11, 2013 (14 pages).
USPTO Office Action for U.S. Appl. No. 12/785,953 dated Oct. 3, 2013 (10 pages).
USPTO Office Action for U.S. Appl. No. 12/861,765 dated Jul. 2, 2012 (11 pages).
USPTO Office Action for U.S. Appl. No. 12/861,765 dated Mar. 7, 2013 (12 pages).
USPTO Office Action for U.S. Appl. No. 12/861,765 dated Sep. 17, 2013 (10 pages).
USPTO Office Action for U.S. Appl. No. 12/861,765 dated Mar. 28, 2014 (12 pages).
USPTO Office Action for U.S. Appl. No. 12/879,784 dated Jan. 25, 2012 (6 pages).
USPTO Notice of Allowance for U.S. Appl. No. 12/879,784 dated Apr. 3, 2012 (7 pages).
USPTO Office Action for U.S. Appl. No. 12/880,803 dated Feb. 22, 2012 (8 pages).
USPTO Notice of Allowance for U.S. Appl. No. 12/880,803 dated Jul. 18, 2012 (5 pages).
USPTO Office Action for U.S. Appl. No. 12/880,889 dated Feb. 27, 2012 (12 pages).
USPTO Office Action for U.S. Appl. No. 12/880,889 dated Sep. 19, 2012 (12 pages).
USPTO Office Action for U.S. Appl. No. 12/936,238 dated Aug. 30, 2012 (11 pages).
USPTO Office Action for U.S. Appl. No. 12/936,238 dated Jan. 30, 2013 (12 pages).
USPTO Notice of Allowance for U.S. Appl. No. 12/936,238 dated Apr. 16, 2013 (9 pages).
USPTO Office Action for U.S. Appl. No. 12/995,946 dated Mar. 28, 2012 (17 pages).
USPTO Office Action for U.S. Appl. No. 12/995,946 dated Jan. 29, 2013 (25 pages).
USPTO Office Action for U.S. Appl. No. 12/995,946 dated Aug. 2, 2013 (15 pages).
USPTO Office Action for U.S. Appl. No. 13/014,622 dated Nov. 28, 2011 (13 pages).
USPTO Office Action for U.S. Appl. No. 13/014,622 dated Apr. 30, 2012 (13 pages).
USPTO Office Action for U.S. Appl. No. 13/019,897 dated Mar. 30, 2012 (14 pages).
USPTO Office Action for U.S. Appl. No. 13/019,897 dated Jan. 16, 2013 (7 pages).
USPTO Office Action for U.S. Appl. No. 13/019,897 dated Jun. 12, 2014 (8 pages).
USPTO Office Action for U.S. Appl. No. 13/025,833 dated Jul. 12, 2012 (15 pages).
USPTO Notice of Allowance for U.S. Appl. No. 13/163,482 dated Jul. 31, 2012 (5 pages).
USPTO Office Action for U.S. Appl. No. 13/179,346 dated Aug. 17, 2012 (17 pages).
USPTO Office Action for U.S. Appl. No. 13/179,346 dated Dec. 13, 2012 (20 pages).
USPTO Office Action for U.S. Appl. No. 13/281,221 dated Jun. 21, 2013 (6 pages).
USPTO Notice of Allowance for U.S. Appl. No. 13/281,221 dated Nov. 12, 2013 (10 pages).
USPTO Office Action for U.S. Appl. No. 13/328,978 dated May 15, 2013 (24 pages).
USPTO Office Action for U.S. Appl. No. 13/328,978 dated Sep. 26, 2013 (25 pages).
USPTO Office Action for U.S. Appl. No. 13/465,976 dated Aug. 16, 2012 (16 pages).
USPTO Office Action for U.S. Appl. No. 13/465,976 dated Dec. 20, 2012 (16 pages).
USPTO Office Action for U.S. Appl. No. 13/548,635 dated Jun. 14, 2013 (5 pages).
USPTO Notice of Allowance for U.S. Appl. No. 13/548,635 dated Sep. 16, 2013 (6 pages).
USPTO Office Action for U.S. Appl. No. 13/548,770 dated Mar. 12, 2013 (5 pages).
USPTO Notice of Allowance for U.S. Appl. No. 13/548,770 dated Jun. 25, 2013 (6 pages).
USPTO Office Action for U.S. Appl. No. 13/629,366 dated Oct. 31, 2013 (7 pages).
USPTO Office Action for U.S. Appl. No. 13/723,968 dated Nov. 29, 2013 (23 pages).
USPTO Office Action for U.S. Appl. No. 13/904,237 dated May 22, 2014 (13 pages).
USPTO Office Action for U.S. Appl. No. 14/171,885 dated Mar. 28, 2014 (8 pages).
Mastro et al., 'Hydride vapor phase epitaxy-grown AlGaN/GaN high electron mobility transistors', Solid-State Electronics, vol. 47, Issue 6, Jun. 2003, pp. 1075-1079.
Morkoc, 'Handbook of Nitride Semiconductors and Devices', vol. 1, 2008, p. 704.
USPTO Office Action for U.S. Appl. No. 13/135,087 dated Aug. 15, 2014 (12 pages).
USPTO Notice of Allowance for U.S. Appl. No. 13/973,213 dated Sep. 16, 2014 (7 pages).
USPTO Office Action for U.S. Appl. No. 14/022,587 dated Jul. 30, 2014 (9 pages).
USPTO Office Action for U.S. Appl. No. 14/054,234 dated Aug. 14, 2014 (24 pages).

\* cited by examiner

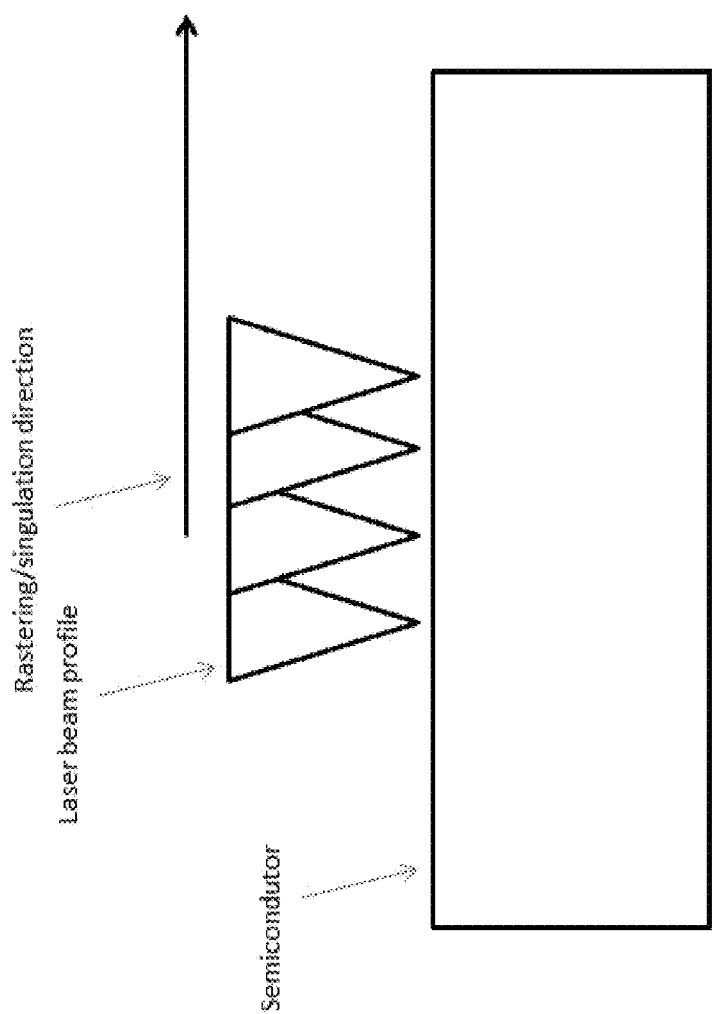

METHODS AND DEVICES FOR LIGHT EXTRACTION FROM A GROUP III-NITRIDE VOLUMETRIC LED USING SURFACE AND SIDEWALL ROUGHENING

This application is a continuation-in-part of U.S. application Ser. No. 12/861,765, filed Aug. 23, 2010, claims the benefit under 35 U.S.C. §119(e) of U.S. Provisional Patent Application No. 61/605,026 filed on Feb. 29, 2012, each of which is incorporated by reference in its entirety.

FIELD

The disclosure relates to the field of LED light chips, and more particularly to techniques for achieving high-performance light extraction from a Group III-nitride volumetric LED chip using surface and sidewall roughening.

BACKGROUND

The present disclosures are directed to an improved approach for achieving high-performance light extraction from a Group III-nitride volumetric LED chips. More particularly, disclosed herein are techniques for achieving high-performance light extraction from a Group III-nitride volumetric LED chip using surface and sidewall roughening.

In making LED chips, improving the performance of light extraction from the material is an important design consideration. In some situations patterning or roughening of certain surfaces can improve light extraction. And, in some situations the materials used in making LEDs (e.g., GaN, Sapphire, SiC) are scribed, sawed, cleaved and otherwise manipulated during process such that those processes result in patterning or roughening of the surfaces of the LED device and/or surrounding structures. However, when Group III-nitride materials (e.g., gallium nitride) is used, traditional cleaving or other manipulations do not necessarily result in patterning or roughening of the surfaces of the LED device and/or surrounding structures, and other techniques are called for in order to achieve high-performance light extraction.

Moreover, the manufacture of Group III-nitride volumetric LED chips might involve cleaving along certain selected planes (e.g., c-plane, m-plane), and certain specific processing techniques (e.g., laser scribing) might be used with the Group III-nitride material, thus further demanding advances in the techniques to produce Group III-nitride volumetric LED chips that exhibit high-performance light extraction from surface and sidewall roughening.

Therefore, there is a need for an improved approach for achieving high-performance light extraction from Group III-nitride volumetric LED chips. In the approach to achieve high-performance light extraction from surface and sidewall roughening when using Group III-nitride materials, many discoveries have been made, which discoveries and embodiments thereto are disclosed in detail below.

SUMMARY

Embodiments of the present disclosures are directed to improved approaches for achieving high-performance light extraction from a Group III-nitride volumetric LED chips. More particularly, disclosed herein are techniques for achieving high-performance light extraction from a Group III-nitride volumetric LED chip using surface and sidewall roughening.

The present disclosure provides improved techniques to address the aforementioned issues with legacy approaches.

More specifically, the present disclosure provides a detailed description of surface and sidewall roughening techniques used to achieve high-performance light extraction from Group III-nitride volumetric LED chips.

The methods refer generally to GaN-based light emitting diodes grown on sapphire, SiC or similar heteroepitaxial substrate. In a specific embodiment, the present techniques provide a device configuration with a high extraction geometry, and fabrication method thereof, for a GaN-based light emitting diode overlying a bulk-GaN containing substrate.

Volumetric chips (e.g., chips where the vertical-to-horizontal aspect ratio of the chip is greater than 5%, and can be on the order of 100% or larger) are advantageous, because they benefit from additional extraction from the sidewalls (e.g., lateral surfaces) of the chip. This helps to extract glancing-angle light. In order to further increase light extraction, one can modify the sidewall facets in order to break these quasi-guided trajectories. This can be done by texturing of the sidewall facets. One way to texture the sidewalls is to produce 1-dimensional roughness, such as vertical striations.

Yet, improvements in extraction efficiency can be achieved by implementing 1-dimensional and 2-dimensional sidewall roughening. In some embodiments, the extraction efficiency for a chip with only top roughness is 70%. With combinations of 1D and 2D sidewall roughness, light extraction is boosted to ~82%.

Further details of aspects, objects, and advantages of the disclosure are described below in the detailed description, drawings, and claims. Both the foregoing general description of the background and the following detailed description are exemplary and explanatory, and are not intended to be limiting as to the scope of the claims.

BRIEF DESCRIPTION OF THE DRAWINGS

FIG. 24 shows the beam profile of a multiple-beam laser ablation tool used in the singulation process of LEDs.

DETAILED DESCRIPTION OF THE EMBODIMENTS

Figure 1:
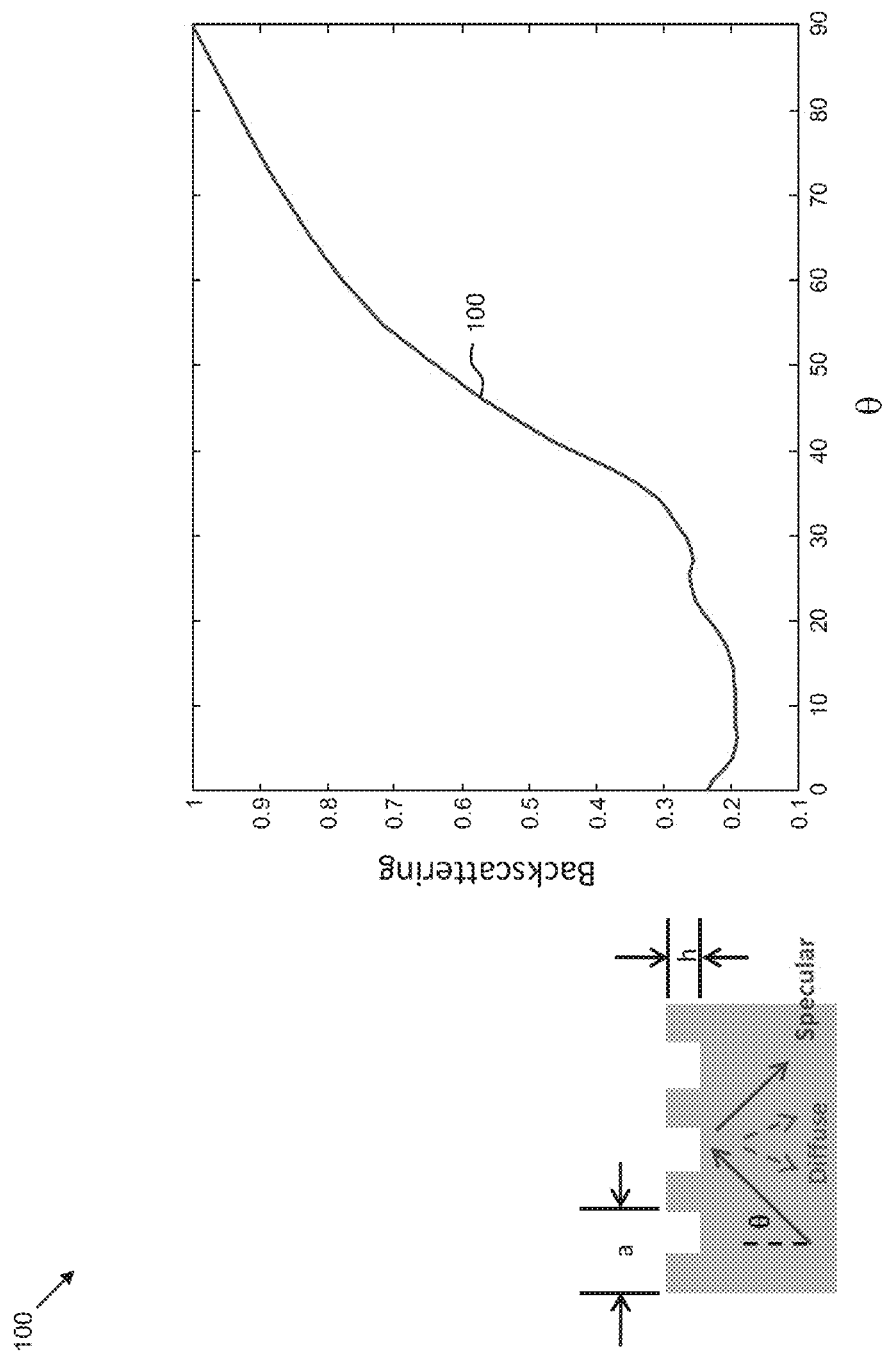
FIG. 1 is a chart characterizing backscattering behavior as a function of polar angle of incidence for achieving high-performance light extraction from a Group III-nitride volumetric LED chip using surface and sidewall roughening, according to some embodiments.

Various embodiments will now be described more fully hereinafter with reference to the accompanying drawings, in which exemplary embodiments are shown. Various aspects may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Embodiments of the present disclosures are directed to improved approaches for achieving high-performance light extraction from a Group III-nitride volumetric LED chips. More particularly, disclosed herein are techniques for achieving high-performance light extraction from a Group III-nitride volumetric LED chip using surface and sidewall roughening.

In making LED chips, improving the performance of light extraction from the material is an important design consideration. In some situations patterning or roughening of certain surfaces can improve light extraction. And, in some situations the materials used in making LEDs (e.g., GaN, Sapphire, SiC) are scribed, sawed, cleaved and otherwise manipulated during process such that those processes result in patterning or roughening of the surfaces of the LED device and/or surrounding structures. However, when Group III-nitride materials (e.g., gallium nitride) is used, traditional cleaving or other manipulations do not necessarily result in patterning or roughening of the surfaces of the LED device and/or surrounding structures, and other techniques are called for in order to achieve high-performance light extraction.

Moreover, the manufacture of Group III-nitride volumetric LED chips might involve cleaving along certain selected planes (e.g., c-plane, m-plane), and certain processing techniques (e.g., laser scribing) might be used with the Group III-nitride material, thus further demanding advances in the techniques to produce Group III-nitride volumetric LED chips that exhibit high-performance light extraction from surface and sidewall roughening.

Therefore, there is a need for an improved approach for achieving high-performance light extraction from Group III-nitride volumetric LED chips. In the approach to achieve high-performance light extraction from surface and sidewall roughening when using Group III-nitride materials, many discoveries have been made, which discoveries and embodiments thereto are disclosed in detail below.

Embodiments of the present disclosure provide improved techniques to address the aforementioned issues with legacy approaches. More specifically, the present disclosure provides a detailed description of surface and sidewall roughening techniques used to achieve high-performance light extraction from Group III-nitride volumetric LED chips.

The methods refer generally to GaN-based light emitting diodes grown on sapphire, SiC or similar heteroepitaxial substrate. In an embodiment, the present techniques provide a device configuration with a high extraction geometry, and fabrication method thereof, for a GaN-based light emitting diode overlying a bulk-GaN containing substrate.

Volumetric chips (e.g., chips where the vertical-to-horizontal aspect ratio of the chip is greater than 5%, and can be on the order of 100% or larger) are advantageous, because they benefit from additional extraction from the sidewalls (e.g., lateral surfaces) of the chip. This helps to extract glancing-angle light. In order to further increase light extraction, one can modify the sidewall facets in order to break these quasi-guided trajectories. This can be done by texturing of the sidewall facets. One way to texture the sidewalls is to produce 1-dimensional roughness, such as vertical striations.

Yet, improvements in extraction efficiency can be achieved by implementing 1-dimensional and 2-dimensional sidewall roughening. In some embodiments, the extraction efficiency for a chip with only top roughness is 70%. With combinations of 1D and 2D sidewall roughness, light extraction is boosted to ~82%.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane where h=k=0, and l is non-zero), non-polar GaN substrates (i.e., substrate material where the largest area surface is oriented at an angle ranging from about 80-100 degrees from the polar orientation described above towards an (h k l) plane where l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane where l=0, and at least one of h and k is non-zero). Of course, there can be other variations, modifications, and alternatives.

The high-refractive index of Group III-nitride based semiconductor devices results in a large fraction of emitted light being totally-internally reflected at the semiconductor/air or semiconductor/encapsulant interface on the first pass. The embodiments contained herein provides methods for enhancing the fraction of emitted light from a light emitting diode device which escapes the semiconductor/air or semiconductor/encapsulant interface on the first pass, and thereby improving the overall external quantum efficiency of the light emitting diode device. This is achieved through texturing or roughening of the sidewalls or side-surfaces of a light emitting diode device chip by applying the methods described in the embodiments below, so as to enhance the extraction of light from these sidewalls or side-surfaces.

For high-power chips, a wafer-bonded geometry is usually used for thermal management. In this case the p-side of the chip is covered by a reflective contact and light is mostly extracted though the top side. To increase light extraction, this top surface is typically roughened in order to randomize light trajectories and avoid guiding of light. To understand how surface roughness improves light extraction in an LED, we model its scattering properties. In the following, we assume roughening features with an average lateral distance on the order of ~1 μm, as is typically obtained by processes such as chemical etching or photo-electro-chemical etching and present in commercial Group III-nitride LEDs. The parameter which drives the scattering strength in the calculations shown below is the so-called filling fraction f, e.g. the area coverage of the scattering features. A small filling fraction corresponds to scattering features with narrow lateral dimensions separated by flat regions, while f>0.5 is representative of GaN roughnesses in some commercial LEDs. The scattering properties of such a surface are illustrated on FIG. 1, which represents the one-bounce backscattering Sb (e.g., the amount of light which is sent back in the semiconductor) for a typical embodiment of a rough surface. A low backscattering corresponds to a large forward-scattering, and hence a large light extraction.

An important parameter in describing a rough surface is the characteristic size of the features forming the roughness. In typical embodiments, this characteristic size is related to the wavelength of light λ and the index of the LED material n. For instance, in some embodiments, the characteristic size is larger than 0.1 time $\lambda/n$ and smaller than 30 times $\lambda/n$. The roughness of the surface can further be described in terms of the shape of features that form the roughened surface. For instance, the roughness can be one-dimensional (e.g. linear striations) or two-dimensional (e.g., surface variations in both in-plane directions). Further, two-dimensional roughness can be composed of a variety of shapes such as pyramidal features, truncated pyramidal features, cylindrical features, square features, spherical features, elliptical features, or a combination of these shapes.

FIG. 1 is a chart characterizing backscattering behavior as a function of polar angle of incidence for achieving high-performance light extraction from a Group III-nitride volumetric LED chip using surface and sidewall roughening. As an option, the present model characterizing backscattering behavior as a function of polar angle of incidence may be implemented in the context of the architecture and functionality of the embodiments described herein. Also, the method for characterizing backscattering behavior as a function of polar angle of incidence or any characteristic therein may be carried out in any desired environment. FIG. 1 shows that Sb becomes close to unity for angles larger than 70°. This indicates that extraction to the outside of the chip is not efficient, and that light will need many bounces to be extracted. FIG. 1 illustrates backscattering of a typical patterned surface versus polar angle of incidence θ (averaged over the azimuthal angle φ). Here the surface is a GaN/epoxy interface made of cylindrical rods (filling fraction f=0.3), height h averaged from 0.8 to 1.2, pitch averaged from 0.8 to 1.2). All distances in units of the free wavelength λ.

Figure 2:
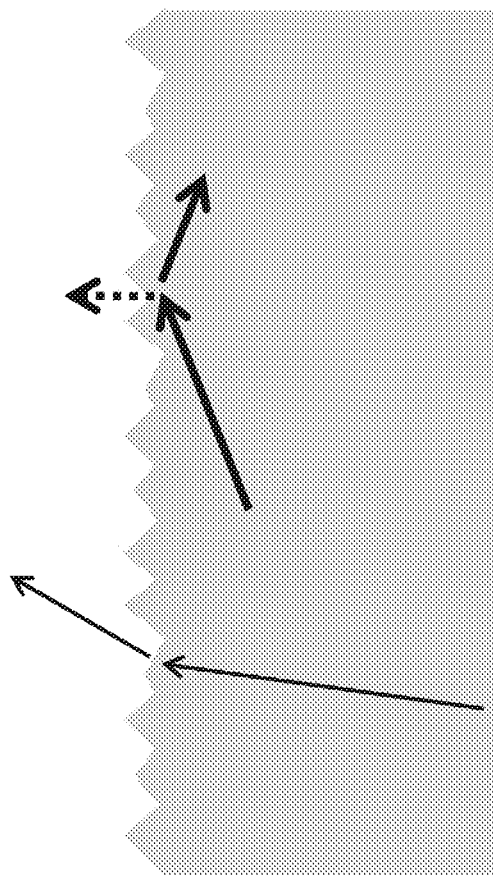
FIG. 2 is a simplified diagram of a model exhibiting backscattering behavior for achieving high-performance light extraction from a Group III-nitride volumetric LED chip using surface and sidewall roughening, according to some embodiments.

From this, we conclude that contrary to intuition, typical 'random' surfaces in LEDs do not necessarily fully randomize light trajectory—most notably, light propagating near glancing angles is poorly extracted/diffused, and mostly undergoes specular reflection. FIG. 2 schematically represents this behavior.

FIG. 2 is a diagram of model exhibiting backscattering behavior for achieving high-performance light extraction from a Group III-nitride volumetric LED chip using surface and sidewall roughening. As an option, the present model exhibiting backscattering behavior may be implemented in the context of the architecture and functionality of the embodiments described herein. As shown, the details of the roughness do not affect these results for features of a given size. FIG. 2 shows the schematic behavior of a typical roughened surface. Light propagating close to normal incidence (thin lines) is efficiently extracted. However, for light propagating near glancing angle (thick lines), only a small fraction of the light is extracted (thick line) while a large fraction is backscattered.

Figure 3:
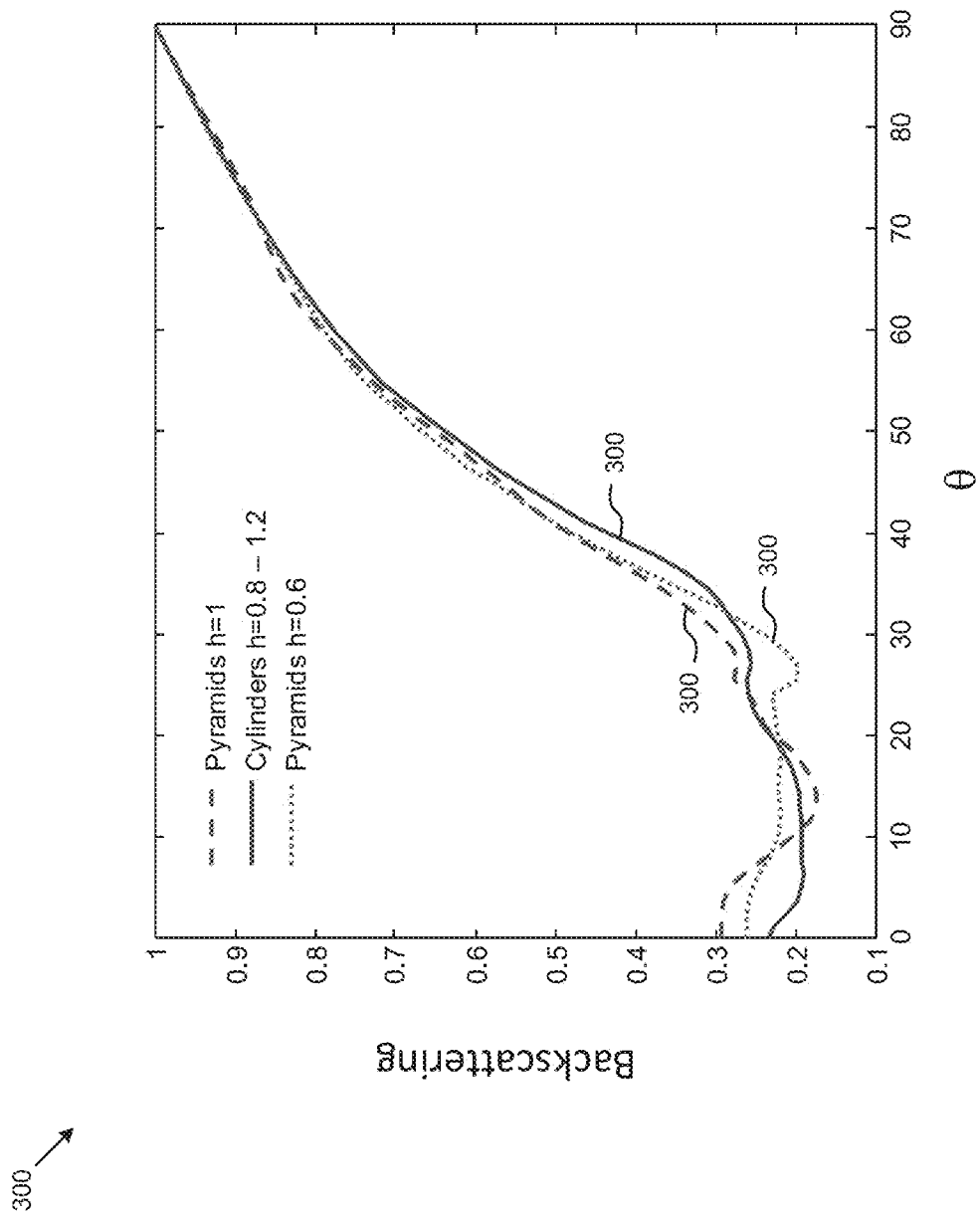
FIG. 3 is a chart characterizing backscattering behavior as a function of polar angle of incidence with various roughening patterns for achieving high-performance light extraction from a Group III-nitride volumetric LED chip using surface and sidewall roughening, according to some embodiments.

FIG. 3 is a chart characterizing backscattering behavior as a function of polar angle of incidence with various roughening patterns for achieving high-performance light extraction from a Group III-nitride volumetric LED chip using surface and sidewall roughening. As an option, the present model characterizing backscattering behavior as a function of polar angle of incidence with various roughening patterns may be implemented in the context of the architecture and functionality of the embodiments described herein.

FIG. 3 illustrates structural features by comparing the scattering behavior of periodic structures having cylindrical and pyramidal features. In this calculation, the rough features have similar sizes, and show similar scattering behavior. This result can be extended to disordered structures by use of a supercell model which considers a periodic structure with a large period whose unit cell is composed of several scattering elements of varying shape and size, and thus approximates the description of a disordered rough surface. Again, use such of a supercell model shows a very similar scattering behavior to that shown in FIG. 3. These scattering properties can be integrated to a ray-tracing light extraction model in order to describe realistic LED chips and understand how the scattering properties impact light extraction. Below are described various applications of such a model to selected geometries of interest. FIG. 3 shows backscattering of various rough surfaces versus polar angle of incidence q: (solid line): cylindrical rods (height averaged from 0.8 to 1.2). Dashed line: pyramids (height 1). Dotted lines: pyramids (height 0.6). All distances in units of the free wavelength 1. All structures have a filling fraction f=0.3.

Thin-Film Chips

Figure 4:
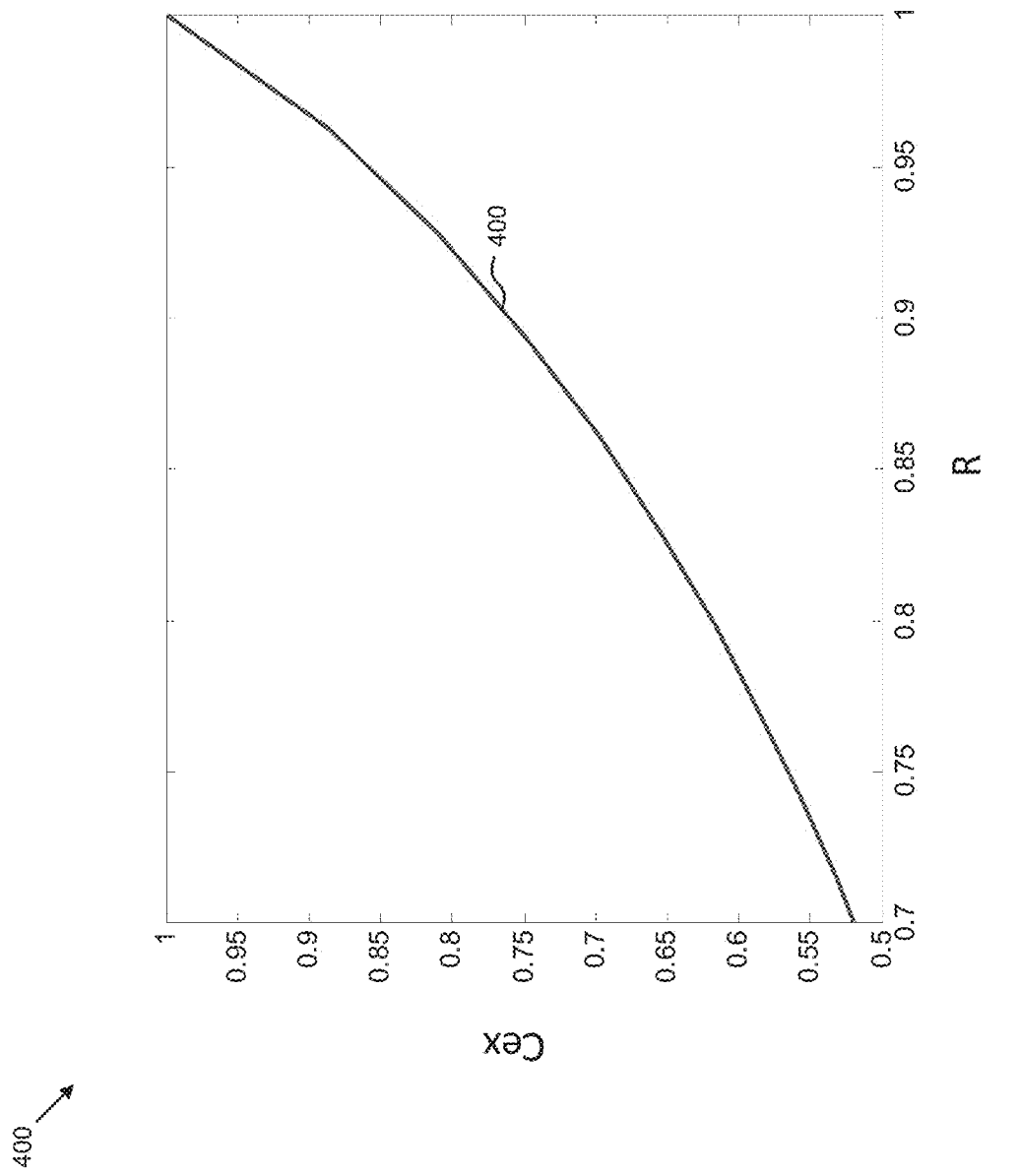
FIG. 4 is a chart characterizing light extraction as a function of top surface roughness for achieving high-performance light extraction from a Group III-nitride volumetric LED chip using surface roughening, according to some embodiments.

Thin-film chips (where the ratio of vertical-to-horizontal dimensions is less than 5%, and often less than 1%) are strongly affected by the scattering behavior of the scattering surface. This is illustrated in FIG. 4 which shows the extraction efficiency Cex of a 1 mm×1 mm×5 μm chip (typical dimensions for commercial power chips) with top surface roughness, as a function of the reflectivity R of the p-mirror. In this simple model, the p-mirror is the only source of loss. A large value of R is necessary to obtain high Cex>80% due to the difficulty to extract glancing-angle light. Additional models (e.g., that model additional characteristics beyond the model of FIG. 4) show similar results.

FIG. 4 is a chart characterizing light extraction as a function of top surface roughness for achieving high-performance light extraction from a Group III-nitride volumetric LED chip using surface and sidewall roughening. As an option, the present model characterizing light extraction as a function of top surface roughness may be implemented in the context of the architecture and functionality of the embodiments described herein. FIG. 4 shows a square thin-film chip (1 mm×1 mm×5 μm) with a top surface roughness and varying p-mirror reflectively.

In this simple model, the p-mirror is the only source of loss. A large value of R is necessary to obtain high Cex>80% due to the difficulty to extract glancing-angle light. This is illustrated in FIG. 5.

Figure 5:
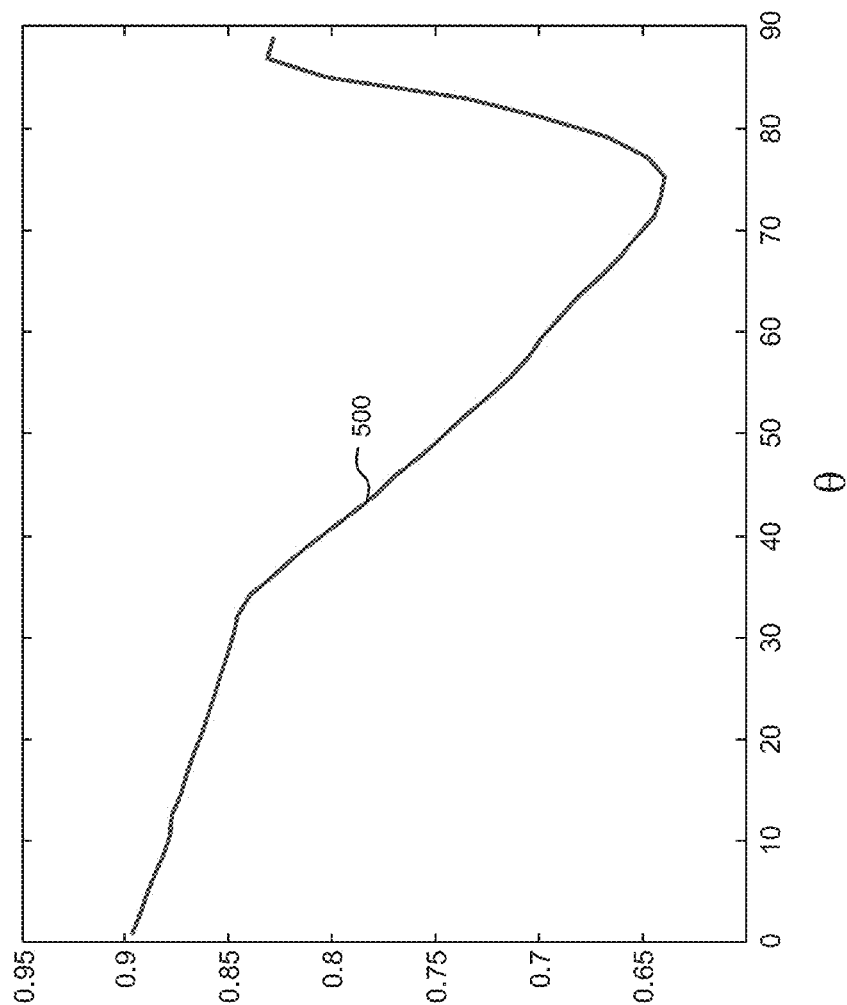
FIG. 5 is a chart characterizing light extraction as a function of polar emission angle for achieving high-performance light extraction from a Group III-nitride volumetric LED chip using surface roughening, according to some embodiments.
Figure 5:

FIG. 5 is a chart characterizing light extraction as a function of polar emission angle for achieving high-performance light extraction from a Group III-nitride volumetric LED chip using surface and sidewall roughening. As an option, the present model characterizing light extraction as a function of polar emission angle may be implemented in the context of the architecture and functionality of the embodiments described herein.

Figure 6:
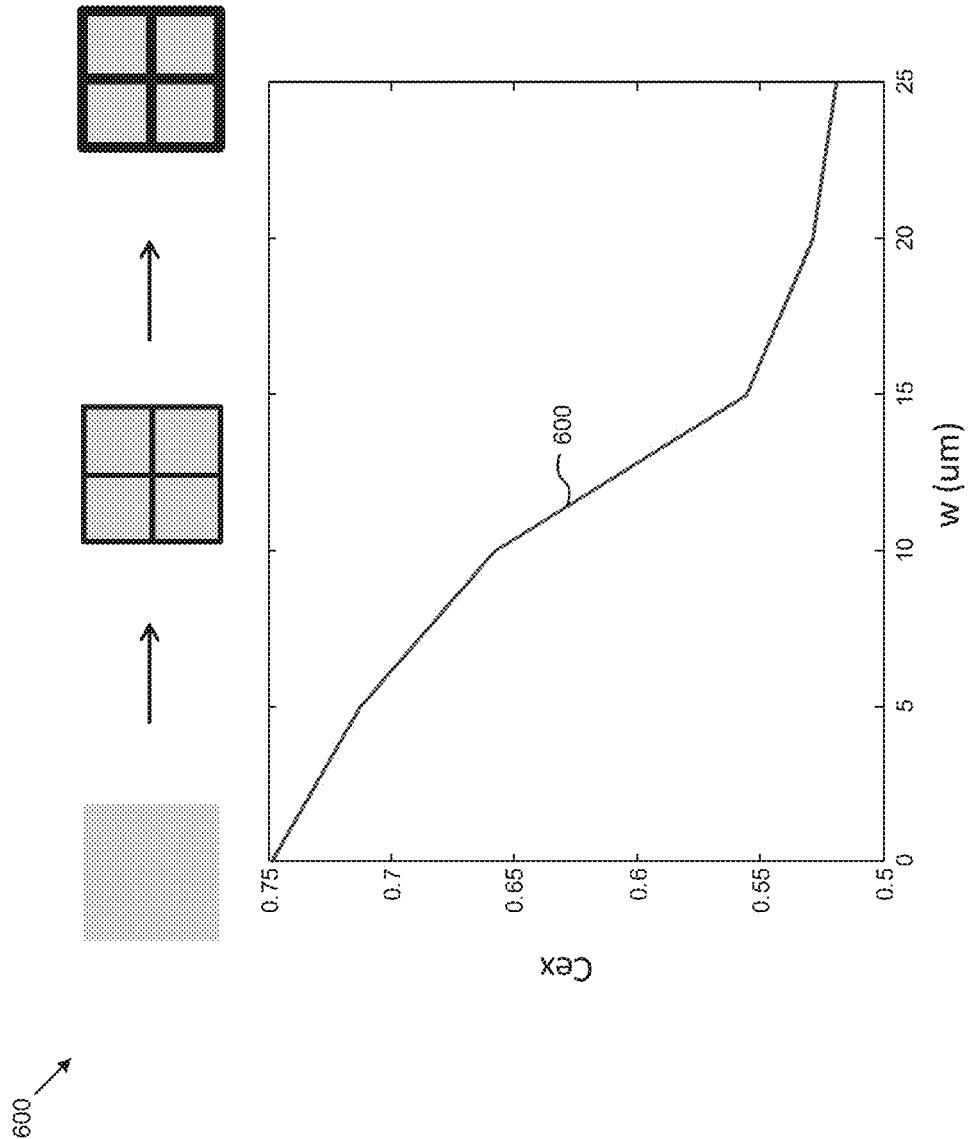
FIG. 6 is a chart characterizing light extraction as a function of n-grid width for achieving high-performance light extraction from a Group III-nitride volumetric LED chip using surface roughening, according to some embodiments.

As shown, FIG. 5 details the extraction efficiency Cex(θ) versus the polar angle of emission φ (averaged over the azimuthal angle φ, and for a p-mirror reflectivity R=90%), and shows a collapse of Cex at large θ. This situation is made even worse if we take into account additional absorbing features (such as n-electrodes) that are present in chips. FIG. 6 illustrates this situation. FIG. 5 shows a square chip (1 mm×1 mm×5 μm) with a top surface roughness and R=90% p-mirror reflectively and details of extraction efficiency as a function of polar emission angle θ (averaged over the azimuthal angle of emission φ). Angle around 50° to 85° are poorly extracted.

FIG. 6 is a chart characterizing light extraction as a function of n-grid width for achieving high-performance light extraction from a Group III-nitride volumetric LED chip using surface and sidewall roughening. As an option, the present model characterizing light extraction as a function of n-grid width may be implemented in the context of the architecture and functionality of the embodiments described herein. Also, the method for characterizing light extraction as a function of n-grid width or any characteristic therein may be carried out in any desired environment. FIG. 6 shows a square chip (1 mm×1 mm) with a top surface roughness and R=90% p-mirror reflectively, varying n-grid width.

The chip of FIG. 6 depicts a chip of similar dimensions but with a square n-grid of pitch a=250 μm, and of low reflectivity (R=50%) and varying grid width w. As w increases, Cex is strongly impacted—this is because glancing-angle light travels large lateral distances and has a high probability of reaching the lossy n-grid. Again, this is seen in detail in FIG. 7.

Figure 7:
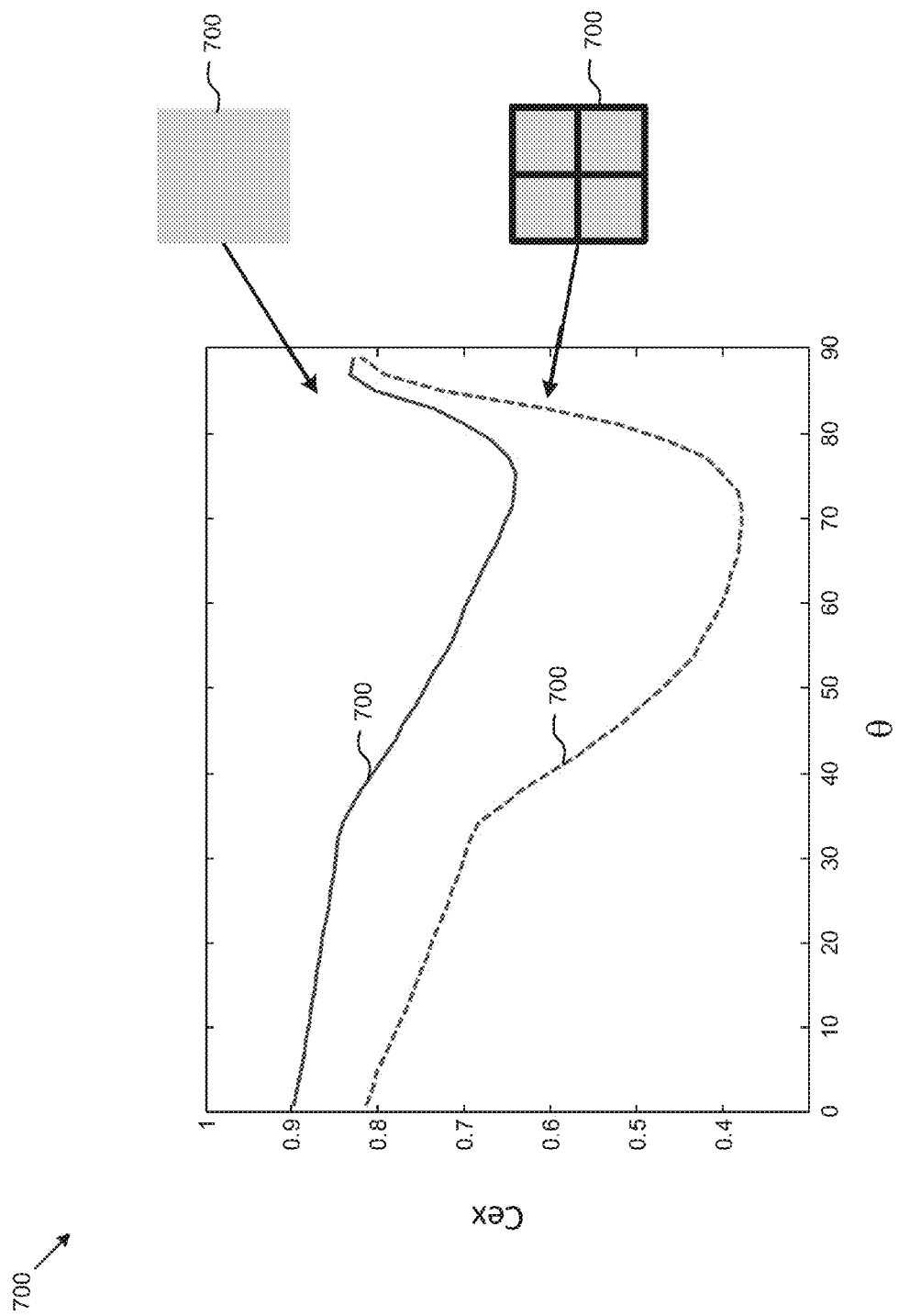
FIG. 7 is a chart characterizing light extraction as a function of polar emission angle, and showing n-grid width examples for achieving high-performance light extraction from a Group III-nitride volumetric LED chip using surface roughening, according to some embodiments.

FIG. 7 is a chart characterizing light extraction as a function of polar emission angle, and showing n-grid width examples for achieving high-performance light extraction from a Group III-nitride volumetric LED chip using surface and sidewall roughening. As an option, the present model characterizing light extraction as a function of polar emission angle, and showing n-grid width examples may be implemented in the context of the architecture and functionality of the embodiments described herein. Also, the techniques for characterizing light extraction as a function of polar emission angle, and showing n-grid width examples or any characteristic therein may be carried out in any desired environment. FIG. 7 shows a square chip (1 mm×1 mm) with top surface roughness and R=9-% p-mirror reflective and details of extraction efficiency as a function of polar emission angle θ. Full lines refer to no n-grid and dashed lines to 15 μm-wide n-grid.

FIG. 7 shows the same angle-dependent light extraction Cex(θ) as is shown in FIG. 5 (for w=15 μm), and where the suppression of Cex at large θ is even more pronounced.

Surface-Roughened Volumetric Chips

Volumetric chips (e.g., chips where the vertical-to-horizontal aspect ratio of the chip is greater than 5%, and can be on the order of 100% or larger) are advantageous, because they benefit from additional extraction from the sidewalls (e.g., lateral surfaces) of the chip. This helps to extract glancing-angle light.

Figure 8:
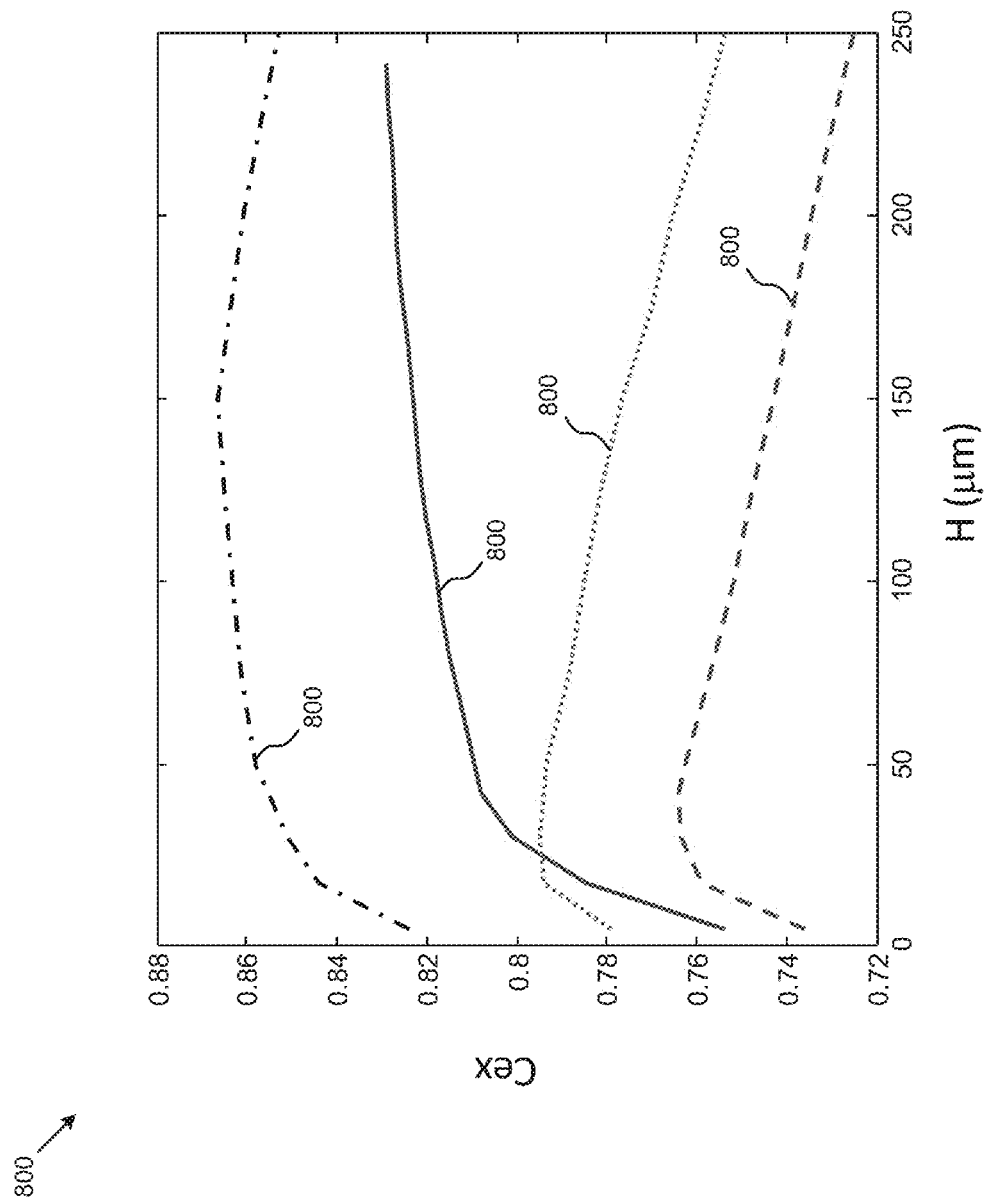
FIG. 8 is a chart characterizing light extraction as a function of chip height and showing examples varying lateral dimensions for achieving high-performance light extraction from a Group III-nitride volumetric LED chip using surface roughening, according to some embodiments.

FIG. 8 is a chart characterizing light extraction as a function of chip height and showing examples of varying lateral dimensions for achieving high-performance light extraction from a Group III-nitride volumetric LED chip using surface and sidewall roughening. As an option, the present model characterizing light extraction as a function of chip height and showing examples varying lateral dimensions may be implemented in the context of the architecture and functionality of the embodiments described herein.

FIG. 8 shows how increasing the thickness of a chip increases its extraction efficiency. First we consider a 1×1 mm surface-roughened chip, with p-mirror reflectivity R=90%.

Increasing the thickness from 5 µm to 250 µm boosts the extraction from ~75% to ~83%, because large-angle light can now be extracted by the sidewalls (e.g., lateral surfaces). However, substrate loss can be present and hinder the beneficial effect of volumetric chips. If we assume a GaN absorption coefficient $\alpha=1$ cm$^{-1}$, extraction is significantly impacted. This can be improved upon by reducing the lateral dimensions of the chip: with the same $\alpha$, a 250×250 µm chip is about 4% more efficient than a 1 mm×1 mm chip. The beneficial impact of sidewalls for light extraction can further be improved by modifying the shape of the chip. For instance, using a chip with a triangular base and the same surface area enables more light trajectories to be extracted. From FIG. 8, the advantage of volumetric chips can be leveraged when the chip dimensions and shape are well chosen, considering the losses in the chip. FIG. 8 shows extraction efficiency vs. chip height, for chips with top surface roughness and R=90% p-mirror reflectivity: (solid line) 1 mm×1 mm square chip, no absorption in the GaN substrate; (dashed line) 1 mm×1 mm square chip, GaN absorption coefficient a=1 cm$^{-1}$; (dotted line) 250 µm×250 µm square chip, GaN absorption coefficient a=1 cm$^{-1}$; (dash-dotted line) Triangular chip (lateral dimension 380 µm), GaN absorption coefficient a=1 cm$^{-1}$.

We note that while we have modeled particular chip designs in the above, and other models of chips, additional sources of loss can be considered, for example: substrate absorption, absorption of all the contacts (p- and n-electrodes and additional interlayers), active region absorption, etc. In some of the following descriptions, realistic values for such losses are modeled.

More insight can be gained into the light-extraction process of such volumetric chips by looking at the angle-resolved extraction diagram $C_{ex}(\theta,\phi)$—here it is relevant to consider both angles. For simplicity, let us first consider a smooth (non-roughened) chip.

Figure 9:
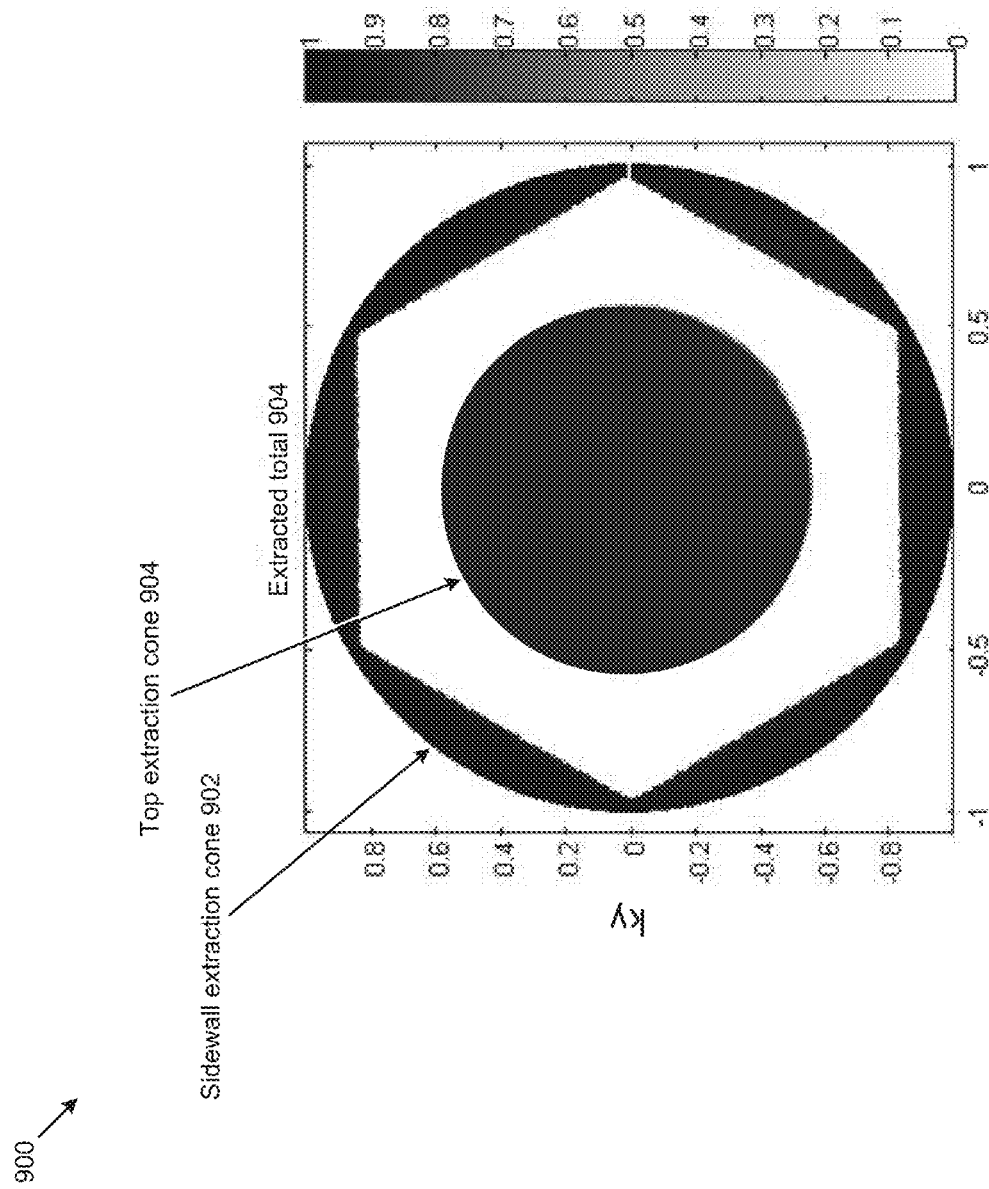
FIG. 9 is a chart characterizing extraction as a function of varied polar and azimuthal angles for a smooth volumetric chip for achieving high-performance light extraction from a Group III-nitride volumetric LED chip, according to some embodiments.

FIG. 9 is a chart showing extraction as a function of varied polar and azimuthal angles for a smooth volumetric chip for achieving high-performance light extraction from a Group III-nitride volumetric LED chip using surface and sidewall roughening. As an option, the present model extraction as a function of varied polar and azimuthal angles for a smooth volumetric chip may be implemented in the context of the architecture and functionality of the embodiments described herein.

FIG. 9 models a smooth GaN volumetric chip (triangular base 380 µm, height 200 µm) emitting into a silicone of index n=1.4. Extraction is only possible into seven extraction cones (one for the top surface, and six for the three sidewalls—either directly or after one in-plane bounce), while all the rest of the light is guided and eventually lost. To improve the extraction of light, in volumetric chips, its top surface can be roughened, which roughening serves to break guided light trajectories. A similar surface roughening approach can also improve light extraction in thin-film chips. FIG. 9 shows details of extraction vs. polar (q) and azimuthal (f) angles, for a smooth volumetric chip with a triangular base (lateral dimension 380 µm, height 200 µm). The direction of emitted light is characterized by the in-plane reduced wavevectors kx and ky. High extraction is obtained into the top extraction cone and the six sidewall extraction cones. No extraction is possible outside of these cones.

Figure 10:
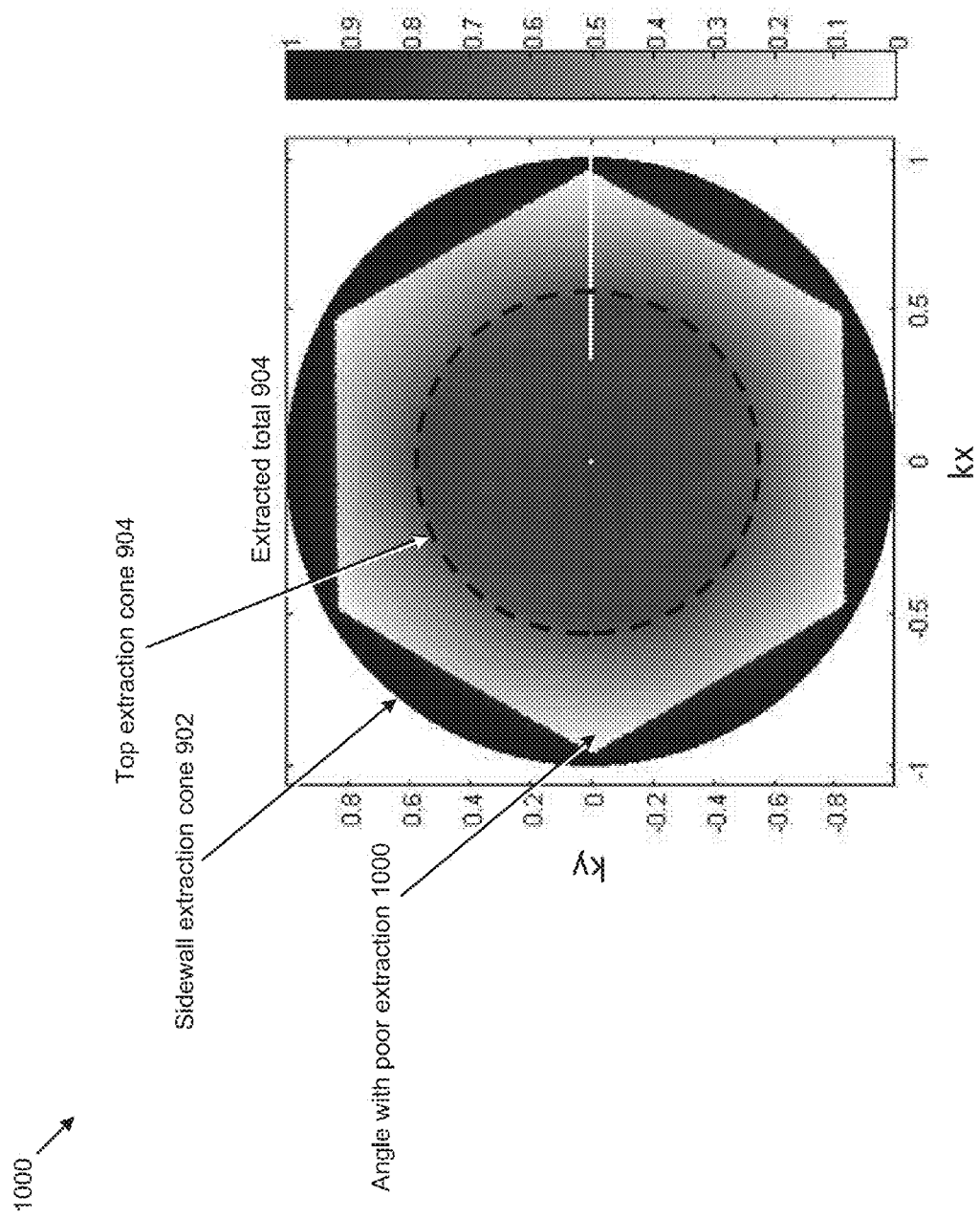
FIG. 10 is a chart showing light extraction as a function of varied polar and azimuthal angles for a surface-roughened volumetric chip for achieving high-performance light extraction from a Group III-nitride volumetric LED chip using surface roughening, according to some embodiments.

FIG. 10 is a chart showing light extraction as a function of varied polar and azimuthal angles for a surface-roughened volumetric chip for achieving high-performance light extraction from a Group III-nitride volumetric LED chip using surface and sidewall roughening. As an option, the present model light extraction as a function of varied polar and azimuthal angles for a surface-roughened volumetric chip may be implemented in the context of the architecture and functionality of the embodiments described herein.

As shown, FIG. 10 illustrates the modification of the angle-resolved extraction diagram when top surface roughness is implemented: Extraction is allowed for angles outside of the extraction cones. However, this is not perfectly efficient because light propagating at large angles is weakly randomized, as was the case for a thin-film chip. Large angles still display limited extraction. Such trajectories, which we refer to as "quasi-guided", limit the extraction efficiency of a GaN volumetric chip with top surface roughness. FIG. 10 shows details of extraction vs. polar (q) and azimuthal (f) angles, for a volumetric chip with a triangular base (lateral dimension 380 µm, height 200 µm) with top surface roughness. Surface roughness enables extraction of some of the light outside of the extraction cones—however this effect is limited, especially at large angles.

Figure 11:
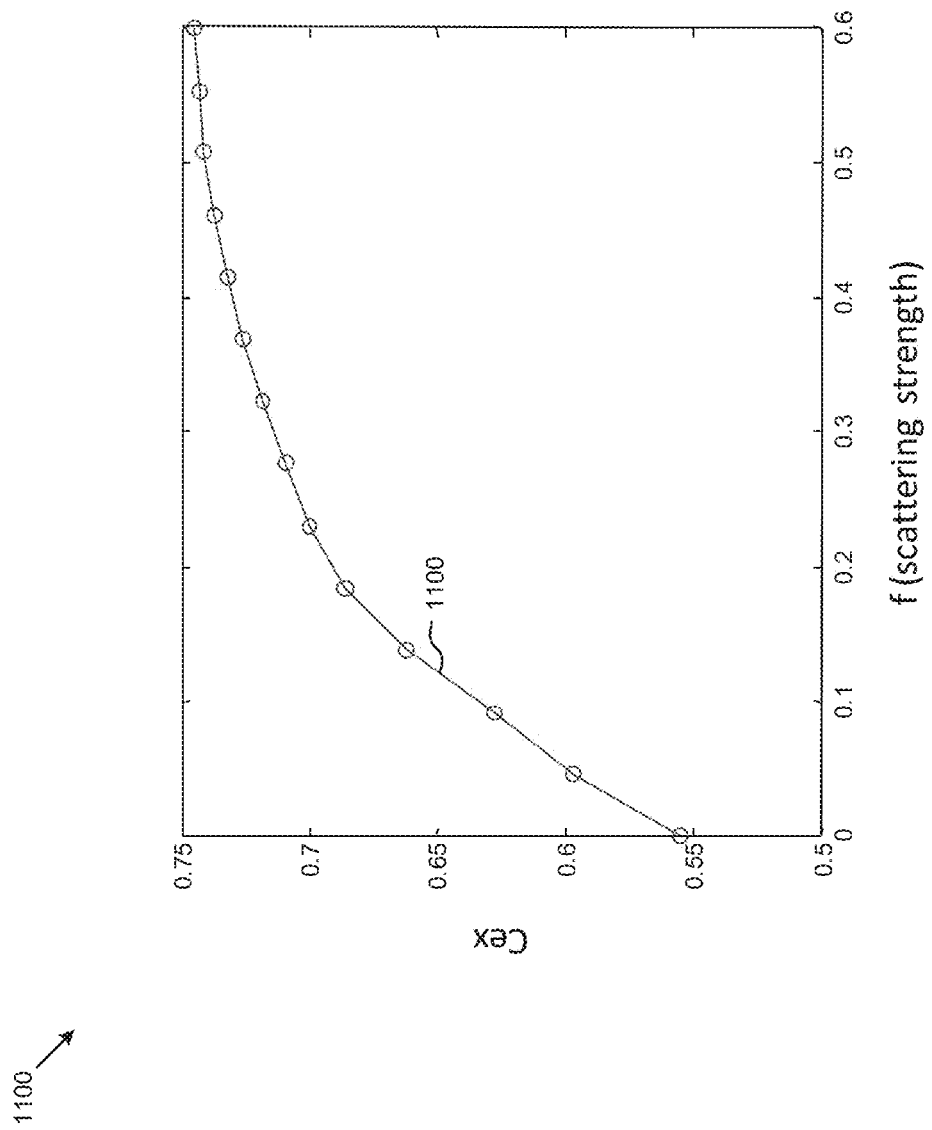
FIG. 11 is a chart showing light extraction as a function of varied polar and azimuthal angles for top surface-roughness for a volumetric chip for achieving high-performance light extraction from a Group III-nitride volumetric LED chip using surface roughening, according to some embodiments.

FIG. 11 is a chart showing light extraction as a function of varied polar and azimuthal angles for top surface roughness for a volumetric chip for achieving high-performance light extraction from a Group III-nitride volumetric LED chip using surface and sidewall roughening. As an option, the present model light extraction as a function of varied polar and azimuthal angles for top surface roughness for a volumetric chip may be implemented in the context of the architecture and functionality of the embodiments described herein.

FIG. 11 shows the total extraction efficiency of a volumetric surface roughness, as the scattering efficiency of the top roughness is varied. The extraction saturates for larger values of the scattering efficiency, because the top roughness never fully breaks quasi-guided trajectories. Here we used the roughness filling fraction as the scattering parameter. A similar result is obtained when increasing the size of the scattering features from ~500 nm to ~1.5 µm. Therefore efficient scattering requires a filling fraction which is high enough (typically >0.5) and a feature size which is large enough (typically ~1 µm). However even using an optimized roughness, light extraction remains limited. FIG. 11 shows Cex vs. top surface roughness for a GaN LED with a triangular base (lateral dimension 380 µm, height 200 µm) and with top surface roughness.

Sidewall-Roughened Volumetric Chips

In order to further increase light extraction, one can modify the sidewall facets in order to break these quasi-guided trajectories. This can be done by texturing of the sidewall facets. One way to texture the sidewalls is to produce 1-dimensional roughness, such as vertical striations. Such striations can naturally be obtained by using a die cleaving method along a proper crystal plane.

Figure 12:
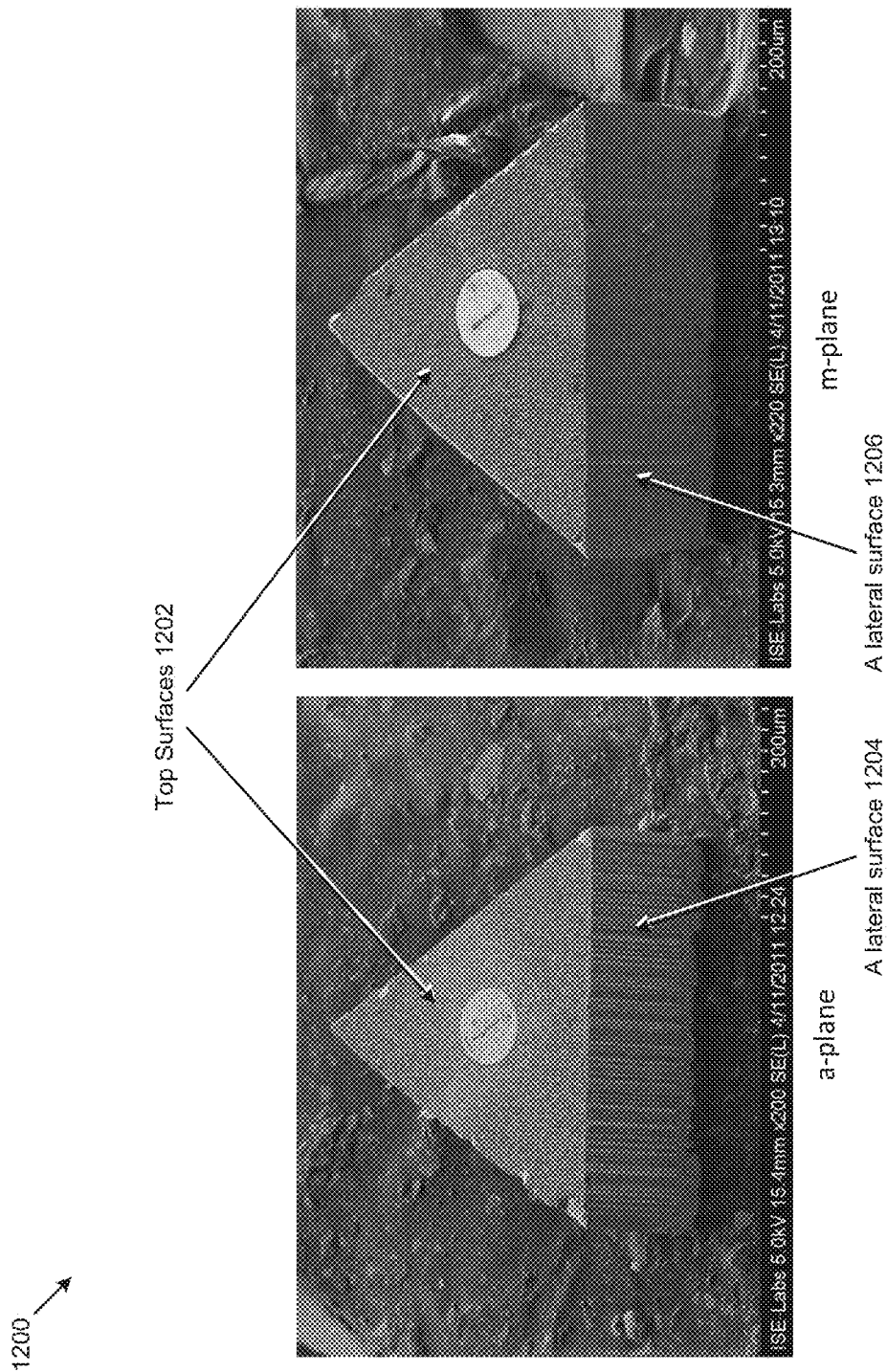
FIG. 12 shows images of LED chips formed by various cleaving along different crystallographic planes, according to some embodiments.

FIG. 12 depicts an image of LED die formed by various cleavings along different crystallographic planes, according to some embodiments. As an option, the present technique of cleaving along different crystallographic planes may be implemented in the context of the architecture and functionality of the embodiments described herein.

FIG. 12 shows the sidewall morphology for two LEDs on bulk GaN substrates which were cleaved with the same method but along two different crystal planes (a- and m-plane, as shown). The natural sidewall roughness obtained in a-plane devices translates experimentally into higher light extraction efficiency. Such roughness is expected to increase light extraction by breaking the threefold in-plane symmetry of light propagation in the chip (e.g., by randomizing the azimuthal angle of propagation $\phi$). FIG. 12 shows scanning electron microscope images of triangular chips cleaved along different crystallographic planes of a GaN substrate. The m-plane chip has relatively smooth sidewalls while the a-plane chip has pronounced one-dimensional roughness.

Figure 21:
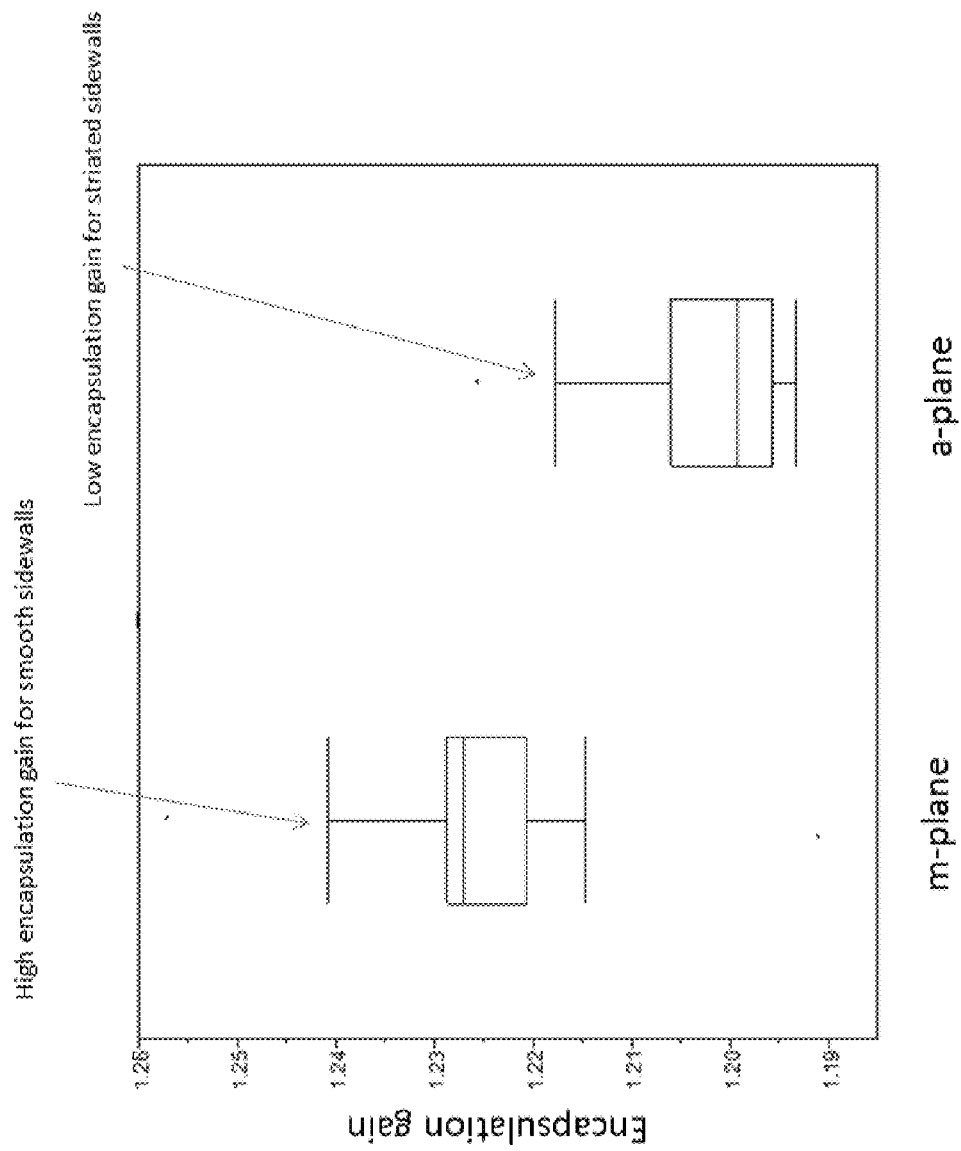
FIG. 21 shows the encapsulation gain performance of LED chips formed by various cleaving along different crystallographic planes, according to some embodiments.

FIG. 21 shows the encapsulation gain measured experimentally on LEDs similar to those of FIG. 12, according to some embodiments.

FIG. 21 shows the encapsulation gain performance of devices cleaved with the same method but along two different crystal planes (a- and m-plane, as shown), similar to the devices of FIG. 12. Encapsulation gain is an indirect measure of extraction efficiency; a lower encapsulation gain indicates a higher extraction efficiency. FIG. 21 shows that a cleave along the a-plane, which produces deeper vertical roughness in the LED's sidewalls, leads to a lower encapsulation gain.

Figure 13:
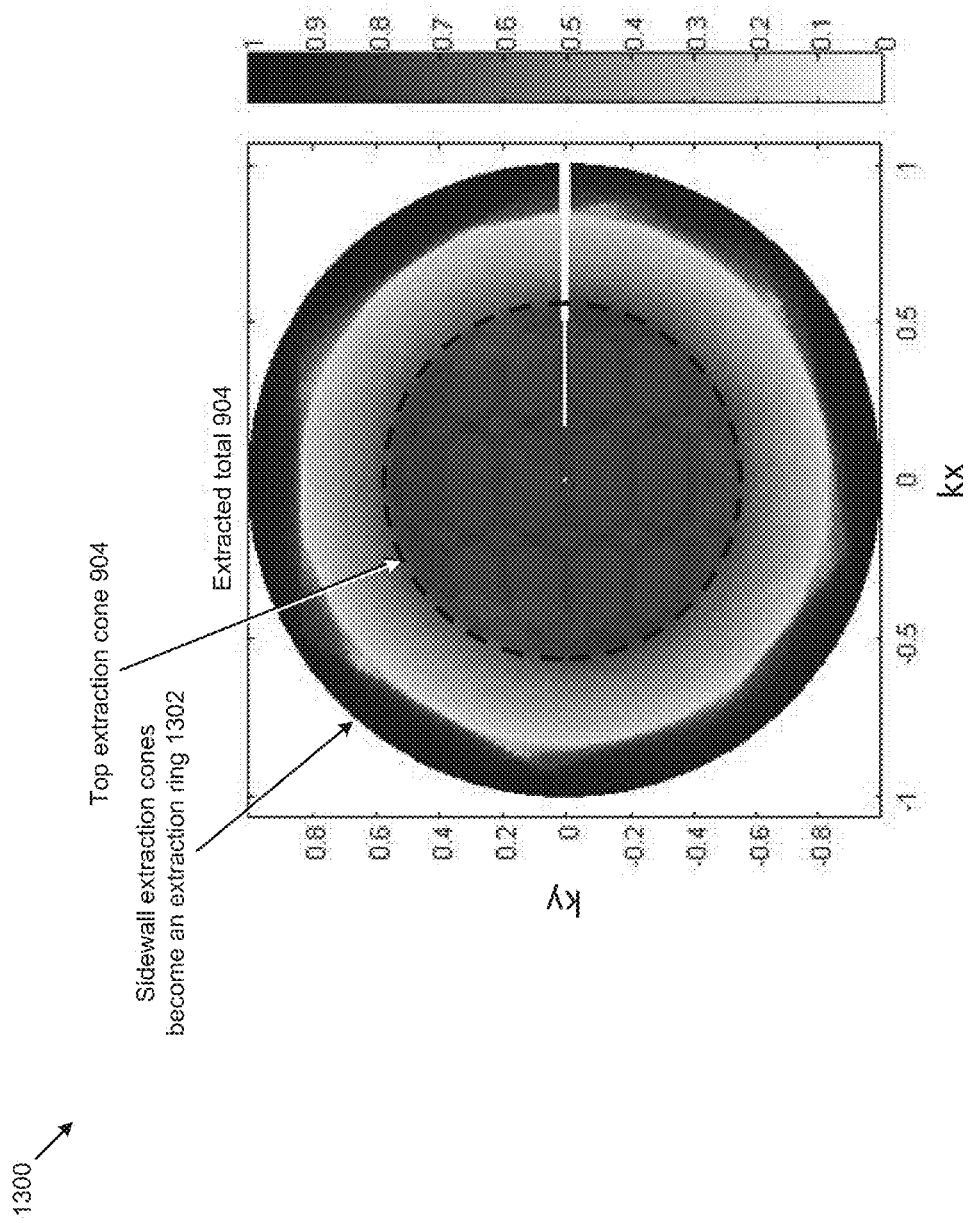
FIG. 13 is a chart showing light extraction as a function of varied polar and azimuthal angles for 1D roughened sidewall surfaces for a volumetric chip for achieving high-performance light extraction from a Group III-nitride volumetric LED chip using surface and sidewall roughening, according to some embodiments.

FIG. 13 is a chart showing light extraction as a function of varied polar and azimuthal angles for 1D roughened sidewall surfaces for a volumetric chip for achieving high-performance light extraction from a Group III-nitride volumetric LED chip using surface and sidewall roughening. As an option, the present model for light extraction as a function of varied polar and azimuthal angles for 1D roughened sidewall surfaces for a volumetric chip may be implemented in the context of the architecture and functionality of the embodiments described herein.

FIG. 13 shows how the angle-resolved extraction diagram of a chip is modified by randomizing the in-plane angles. Some quasi-guided trajectories are broken, resulting in larger extraction efficiency. As seen on FIG. 13 however, the polar propagation angles are not randomized (because the sidewall roughness is vertical, and thus does not break symmetry in the vertical direction) and some quasi-guided trajectories remain for intermediate angles. Another way to texture the sidewalls is to introduce a two-dimensional texture—e.g. to break the planarity of the sidewalls along two directions. FIG. 13 shows details of extraction vs. polar (q) and azimuthal (f) angles, for a volumetric chip with a triangular base (lateral dimension 380 μm, height 200 μm) with top surface roughness and 1D sidewall roughness. Due to randomization of (f), extraction is improved for some large angles. The six side extraction cones effectively become an "extraction ring". Extraction is still limited at intermediate angles.

Figure 14:
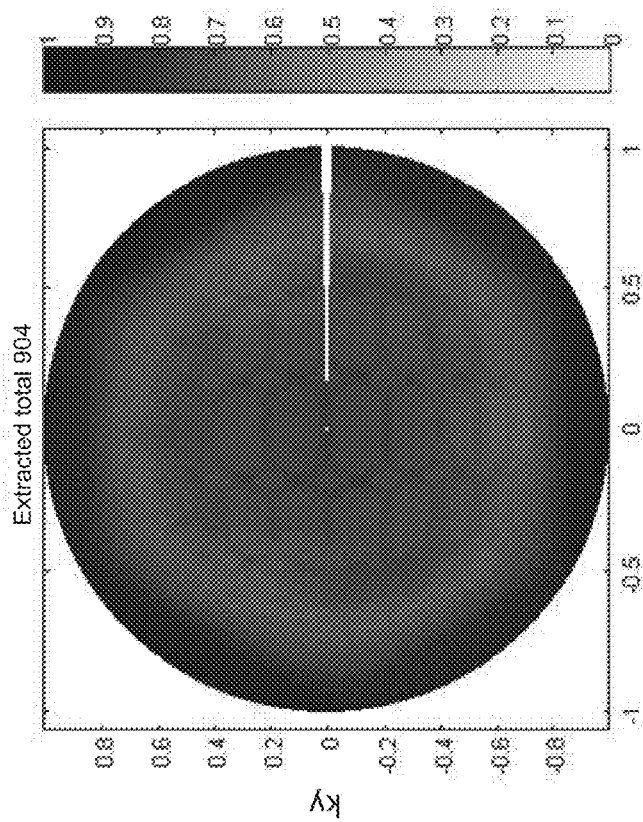
FIG. 14 is a chart showing light extraction as a function of varied polar and azimuthal angles for 2D roughened sidewall surfaces for a volumetric chip having a triangular base for achieving high-performance light extraction from a Group III-nitride volumetric LED chip using surface and sidewall roughening, according to some embodiments.

FIG. 14 is a chart showing light extraction as a function of varied polar and azimuthal angles for 2D roughened sidewall surfaces for a volumetric chip having a triangular base for achieving high-performance light extraction from a Group III-nitride volumetric LED chip using surface and sidewall roughening. As an option, the present model for light extraction as a function of varied polar and azimuthal angles for 2D roughened sidewall surfaces for a volumetric chip having a triangular base may be implemented in the context of the architecture and functionality of the embodiments described herein. FIG. 14 shows details of extraction vs. polar (q) and azimuthal (f) angles, for a volumetric chip with a triangular base (lateral dimension 380 μm, height 200 μm) with top surface roughness and 2D sidewall roughness. All angles are efficiently randomized, either by the top or the sidewall roughness, resulting in high extraction at all angles.

FIG. 14 shows the corresponding light extraction diagram. In such a case, both polar and azimuthal angles are randomized upon incidence on the textured sidewall, which can further increase light extraction. Extraction is substantially improved over some embodiments following the light extraction model of FIG. 13, especially in certain angular domains.

Figure 15:
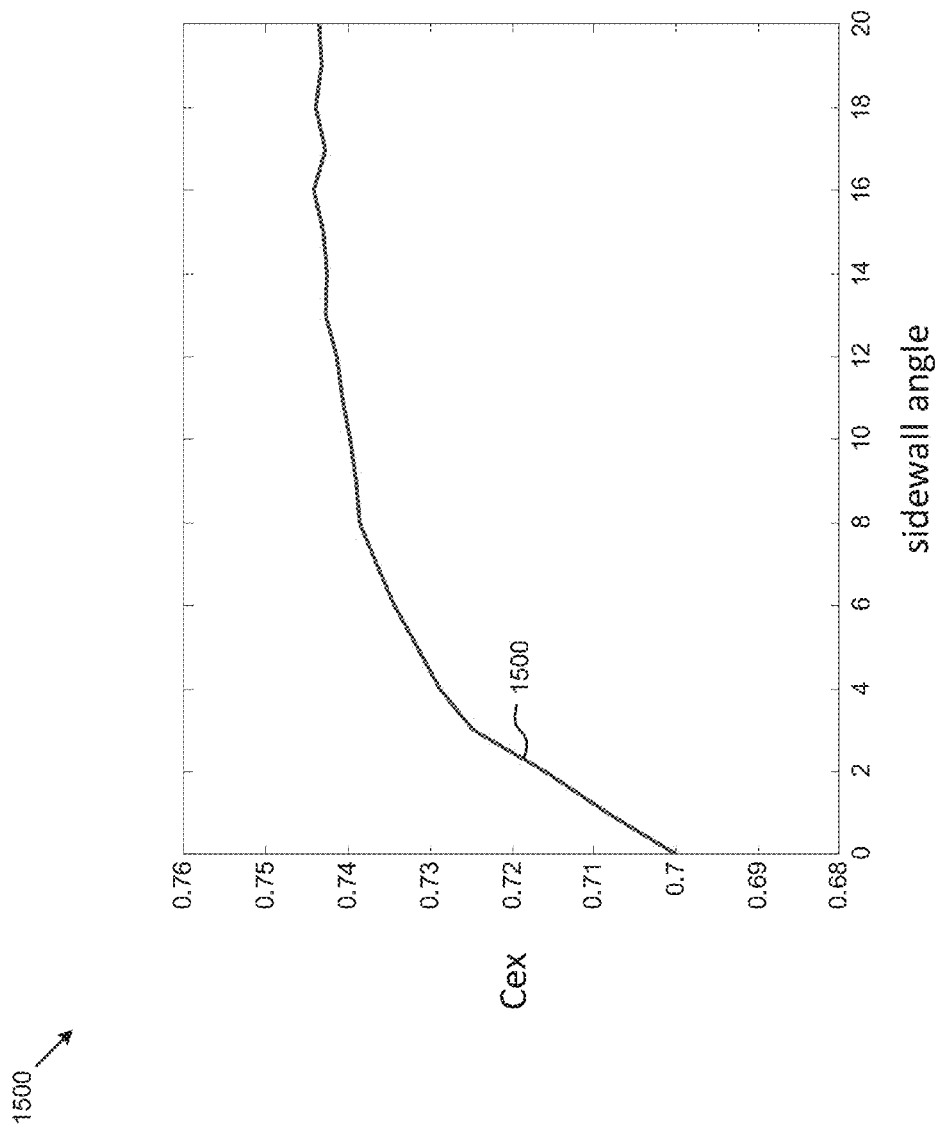
FIG. 15 is a chart showing light extraction for 1D roughened sidewall surfaces as a function of sidewall angle for a volumetric chip having a triangular base for achieving high-performance light extraction from a Group III-nitride volumetric LED chip using surface and sidewall roughening, according to some embodiments.
Figure 16:
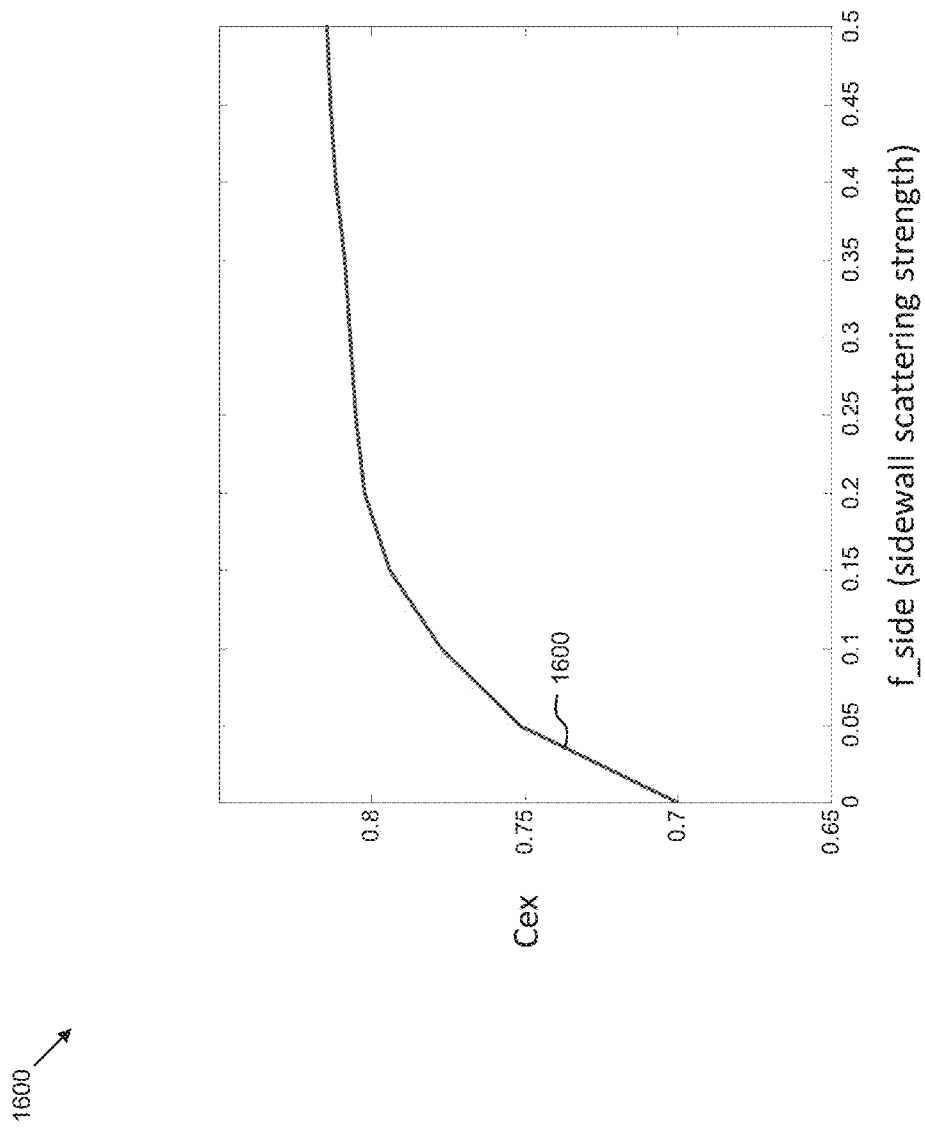
FIG. 16 is a chart showing light extraction for 2D roughened sidewall surfaces as a function of sidewall angle for a volumetric chip having a triangular base for achieving high-performance light extraction from a Group III-nitride volumetric LED chip using surface and sidewall roughening, according to some embodiments.

FIG. 15 and FIG. 16 exemplify the improvement in extraction efficiency predicted by implementing 1-dimensional and 2-dimensional sidewall roughening. With the loss parameters chosen, the extraction efficiency for a chip with only top roughness is 70%. 1D and 2D sidewall roughness boost extraction to ~74% and ~82%, respectively.

FIG. 15 is a chart showing light extraction for 1D roughened sidewall surfaces as a function of sidewall skewing angle for a volumetric chip having a triangular base for achieving high-performance light extraction from a Group III-nitride volumetric LED chip using surface and sidewall roughening. As an option, the present model for light extraction for 1D roughened sidewall surfaces as a function of sidewall angle for a volumetric chip having a triangular base may be implemented in the context of the architecture and functionality of the embodiments described herein. FIG. 15 shows Cex vs. one-dimensional sidewall roughness (the x-axis of this plot is the average angle of the sidewalls with respect to planar sidewalls) for a GaN LED with a triangular base (lateral dimension 380 μm, height 200 μm) and with top surface roughness.

FIG. 16 is a chart showing light extraction for 2D roughened sidewall surfaces as a function of sidewall angle for a volumetric chip having a triangular base for achieving high-performance light extraction from a Group III-nitride volumetric LED chip using surface and sidewall roughening. As an option, the present model for light extraction for 2D roughened sidewall surfaces as a function of sidewall angle for a volumetric chip having a triangular base may be implemented in the context of the architecture and functionality of the embodiments described herein. FIG. 16 shows Cex vs. two-dimensional sidewall roughness for a GaN LED with a triangular base (lateral dimension 380 μm, height 200 μm) and with top surface roughness.

In comparing the light extraction of FIG. 15 to the light extraction of FIG. 16, the improvements can be seen.

Figure 17:
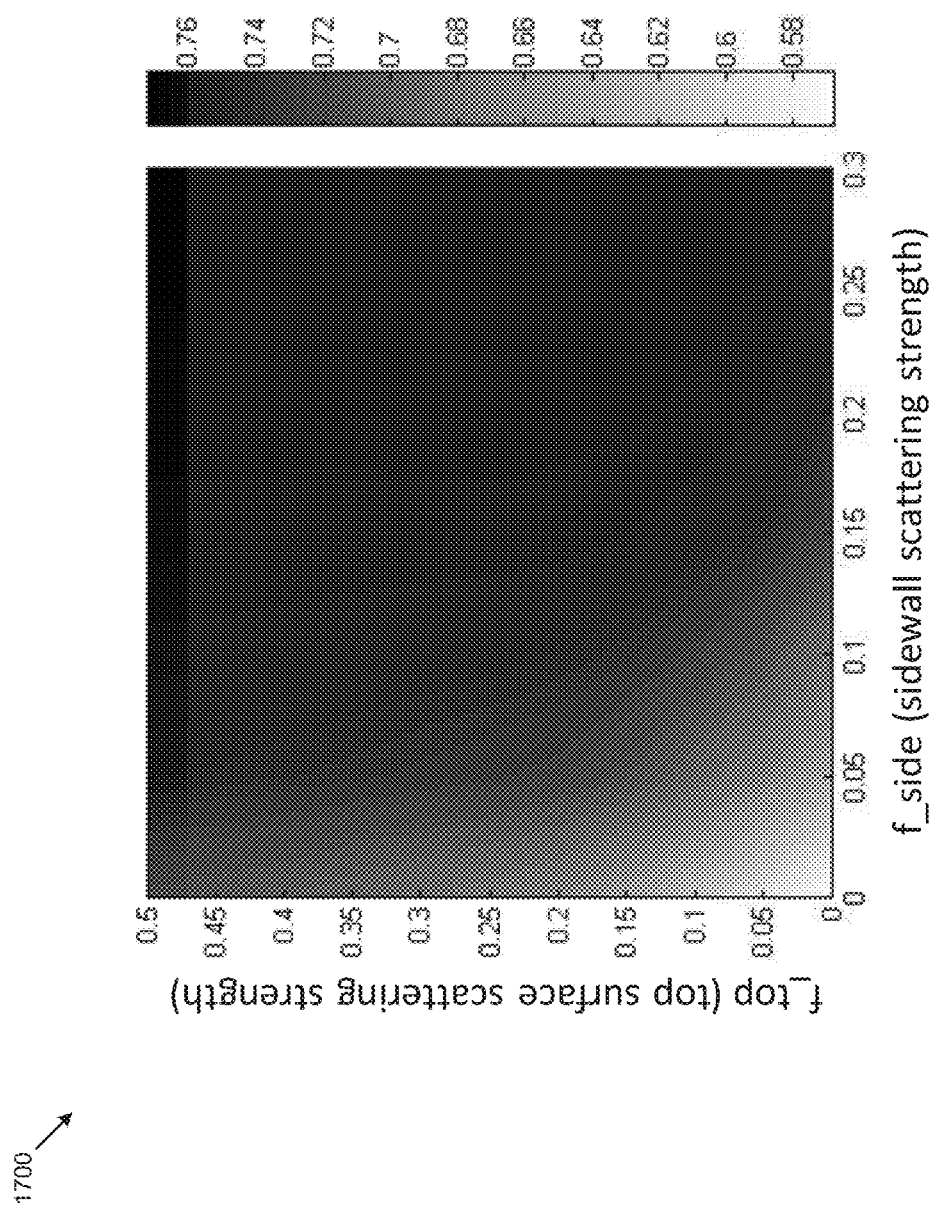
FIG. 17 is a chart showing light extraction under varied sidewall and top roughness for a volumetric chip having a triangular base for achieving high-performance light extraction from a Group III-nitride volumetric LED chip using surface and sidewall roughening, according to some embodiments.

FIG. 17 is a chart showing light extraction under varied sidewall and top roughness for a volumetric chip having a triangular base for achieving high-performance light extraction from a Group III-nitride volumetric LED chip using surface and sidewall roughening. As an option, the present model for light extraction under varied sidewall and top roughness for a volumetric chip having a triangular base may be implemented in the context of the architecture and functionality of the embodiments described herein.

FIG. 17 shows a 2-dimensional map of expected improvement by combining surface roughness and 2D sidewall roughness, for a variety of scattering strengths. Typical top surface roughness obtained by chemical or PEC etching can be described by a scattering strength f>0.4. Therefore, complementing such a top surface roughness with a moderate sidewall roughness f>0.15 is sufficient to achieve optimal extraction. FIG. 17 shows Cex vs. sidewall and top roughness for a GaN LED with a triangular base (lateral dimension 380 μm, height 200 μm) and with 2-dimensional top and sidewall surface roughness.

In the following embodiments, "texturation" or "roughness" describes an optical surface which deviates from planarity. The roughness may be random, periodic (as in the case of a photonic crystal for instance) or pseudo-periodic. The roughness may be produced by a variety of means, including chemical etching, electro-chemical etching, photo-electrochemical etching, patterning and dry etching, regrowth of semiconductor material over a patterned interface, roughness due to a sawing/cleaving/laser scribing singulation process.

In one embodiment, the singulation process (which may combine laser scribing, sawing and cleaving) produces sidewall roughness.

In one embodiment, the present method and device includes a gallium and nitrogen (e.g., GaN) containing substrate having roughened regions vertically oriented with respect to a pair of electrode faces. In an embodiment, the electrode faces are configured on a c-plane. Preferably, the substrate is separated by way of scribing, which occurs using a laser scribing process having a short wavelength laser. The beam ablates by pulsing electromagnetic radiation on selected portions of the gallium and nitrogen containing substrate. The beam scribes the substrate along the a-plane. Preferably, the streets between devices are configured from about 1 to about 30 microns, although there can be variations. Each of the scribe regions has a width of 5 to 10 microns. The scribe regions are formed using a UV laser configured with a 355 nm source and an output power of 30 to 300 milli-Watts, but can be others. The laser pulses are in the nano-second regime, e.g., 2-100 nanoseconds. The laser device and beam ablates a portion of the gallium and nitrogen containing material. The devices are later separated using a break process along the scribe lines causing formation of the roughened regions, which are substantially m-plane in characteristic and forms the vertically oriented facets. Each of the m-faces has width of a few microns, but can also be other dimension. Additionally, each of the facets has a peak region surrounded by troughs, when viewed from the c-plane direction. Optionally, the method subjects the scribe region to a selective etchant to remove any light absorbing slag material, which may be a by-product from the laser scribing process. Depending on the laser pulsing frequency, stage speed, and chemistry used for removing the by-product from the laser scribe process, a 2D roughness region with equal depth to the laser scribe can be created on the sidewalls of the device to greatly enhance light extraction. The selection of the chemistry for removal of the by-products is extremely important as some chemistry will tend to look for crystal plans and smooth out the region, while others induce roughness such as KOH. In some embodiments for creating 2D roughness regions, the process creates two distinct regions on the sidewalls.

In some embodiments, the same procedure as above is employed. However, the laser ablation process is sufficient to fully ablate the substrate and produce full device singulation, so that no subsequent breaking step is required. In such embodiments, the 2D roughness region created by the laser ablation covers a large fraction, up to the totality, of the sidewalls.

In some embodiments, the LED is made of bulk GaN and has the shape of a prism with a triangular base. The top surface and the sidewalls all display 2-dimensional roughness, with a roughness feature size on the order of 1-2 micron and a roughness surface coverage larger than 0.5.

In another embodiment, the LED is made of bulk GaN and has the shape of a prism with a triangular base. The top surface displays 2-dimensional roughness, with a roughness feature size on the order of 1-2 micron and a roughness surface coverage larger than 0.5. The sidewalls display vertical striations (1D roughness) with a characteristic distance of 1-5 µm.

Figure 18:
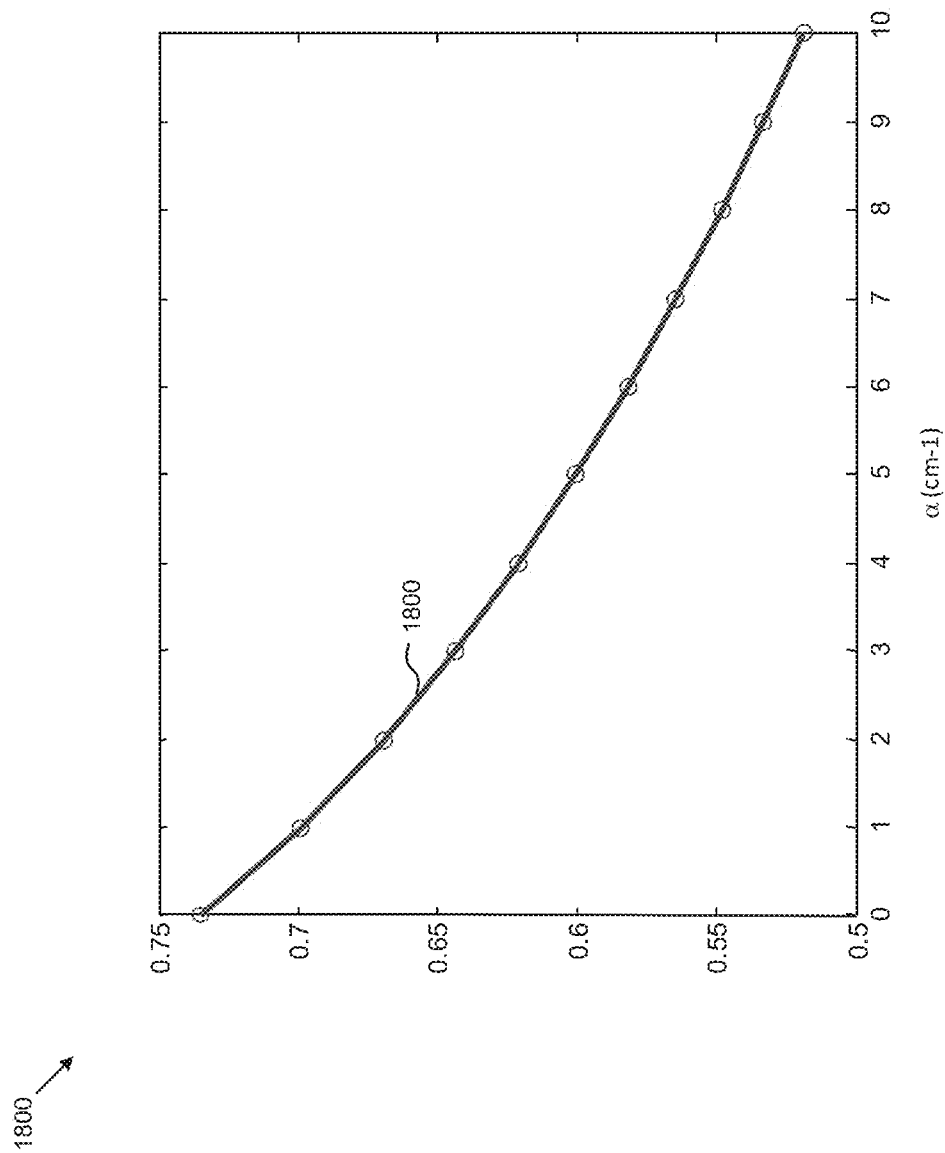
FIG. 18 is a chart showing light extraction under varied substrate absorption for a volumetric chip having a triangular base for achieving high-performance light extraction from a Group III-nitride volumetric LED chip using surface and sidewall roughening, according to some embodiments.

FIG. 18 is a chart showing light extraction under varied substrate absorption for a volumetric chip having a triangular base for achieving high-performance light extraction from a Group III-nitride volumetric LED chip using surface and sidewall roughening. As an option, the present model for light extraction under varied substrate absorption for a volumetric chip having a triangular base may be implemented in the context of the architecture and functionality of the embodiments described herein.

FIG. 18 describes the impact of absorption coefficient on extraction efficiency. The Group III-nitride substrate has a crystal orientation such that its sidewalls can easily be roughened. FIG. 18 shows Cex vs. GaN substrate absorption a for a triangular chip (lateral dimension 380 µm, height 200 µm) with top surface roughness.

According to some embodiments:
Only some of the sidewalls are roughened.
The sidewalls are slanted and roughened.
The LED is grown on a bulk Group III-nitride substrate, and the resulting vertical-to-horizontal aspect ratio of the LED chip is larger than 5%.
The LED is grown on a foreign substrate, but the Group III-nitride layer is thick enough that the vertical-to-horizontal aspect ratio of the LED chip is larger than 5%.
The absorption coefficient of the Group III-nitride film is lower than $10 \text{ cm}^{-1}$, than $1 \text{ cm}^{-1}$.

Figure 19:
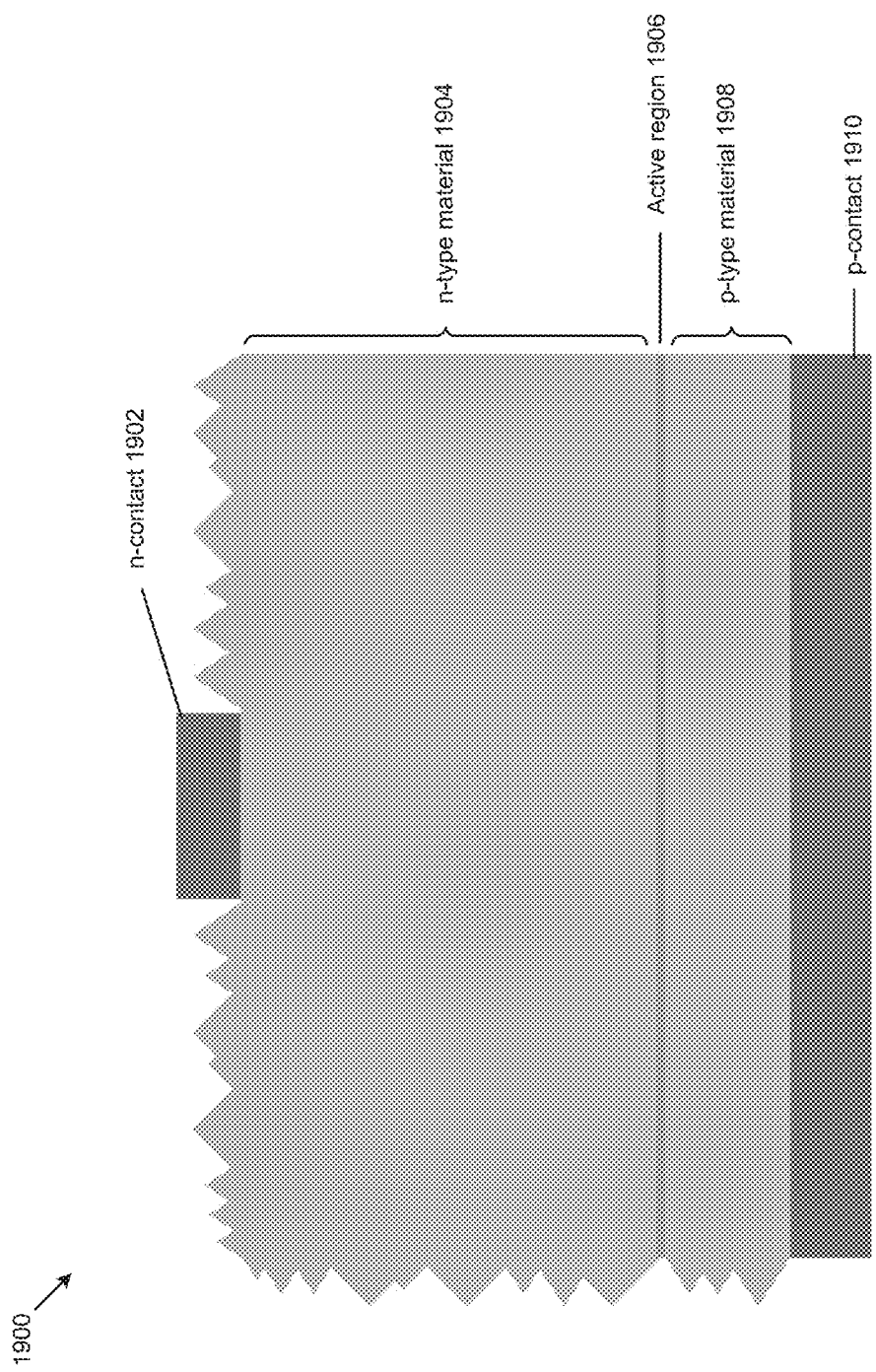
FIG. 19 is a simplified schematic diagram of a light emitting diode device having a top surface region with a textured surface characterized by a surface roughness of about 80 nm to about 10,000 nm; and a lateral surface region having a textured surface characterized by a surface roughness of about 80 nm to about 10,000 nm for achieving high-performance light extraction from a Group III-nitride volumetric LED chip using surface and sidewall roughening, according to some embodiments.

FIG. 19 shows a light emitting diode device having a top surface region with a textured surface characterized by a surface roughness of about 80 nm to about 10,000 nm; and a lateral surface region having a textured surface characterized by a surface roughness of about 80 nm to about 10,000 nm. As an option, the present light emitting diode device may be implemented in the context of the architecture and functionality of the embodiments described herein. Or, the present light emitting diode device or any characteristic therein may be preset in any desired environment. FIG. 19 shows a light emitting diode device having n-type material overlying an active region, in turn overlaying p-type epitaxial material. An n-contact is coupled to the n-type epitaxial material and a p-contact is coupled to the p-type epitaxial material. The top surface region has a textured surface characterized by a surface roughness of about 80 nm to about 10,000 nm; and at least one lateral surface region having a textured surface characterized by a surface roughness of about 80 nm to about 10,000 nm.

Figure 20:
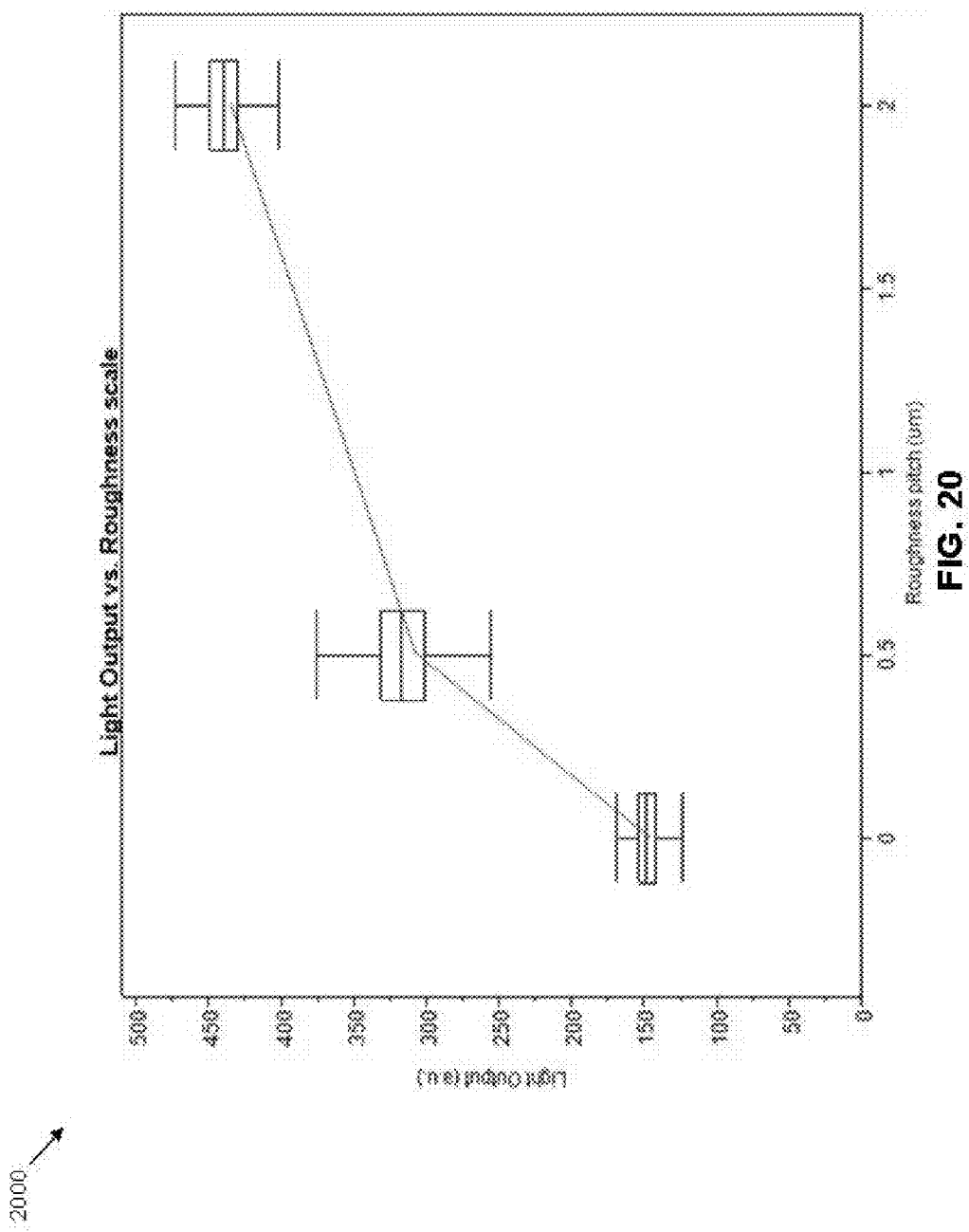
FIG. 20 shows light extraction as a function of roughness, according to some embodiments.

FIG. 20 shows light extraction as a function of roughness, according to some embodiments. Application of the surprising results as shown in FIG. 20 yields a technique for fabricating a light emitting diode device having roughened regions. Strictly as an example, fabricating a light emitting diode device having roughened regions can commence by providing a gallium and nitrogen containing substrate including a top surface region, a lateral surface region, an n-type epitaxial material overlying a portion of the top surface region. One or more active regions can be formed overlying the n-type epitaxial material, and p-type epitaxial material disposed to overly the one or more active regions. Then, a first electrode can be coupled to the n-type epitaxial material (or the substrate material), and a second electrode coupled to the p-type epitaxial material.

FIG. 20 shows performance for surface-roughened LEDs where the typical feature size of the roughness is varied. As observed in FIG. 20, increasing the feature size beyond 1 µm leads to an improvement in performance. This can be justified by considering scattering theory: scattering features smaller than the wavelength of light (e.g., ~400 nm) are in the Rayleigh scattering regime, where scattering increases with feature size. This leads to the trend observed on FIG. 20. This trend is expected to saturate as features become larger than 1 µm and scattering enters a geometric regime. Therefore, FIG. 20 suggests minimum feature sizes for a good surface roughness. Feature sizes larger than 1 µm provide the best scattering, while feature sizes in the range 100 nm-1 µm provide a decent, although non-optimal, range.

Likewise, there is a practical maximum for the feature size which is desirable. Features of tens or hundreds of microns become comparable with the overall shape of the LED and can be impractical to form and handle. Therefore, the range 1

μm 10 μm may be considered a preferred range because it leads to good scattering and is practical.

Various techniques can be used to form singulation regions, and various techniques can be used for separating at the singulation region boundaries. Optimizing said techniques can improve the roughness, and hence the extraction efficiency.

Figure 22:
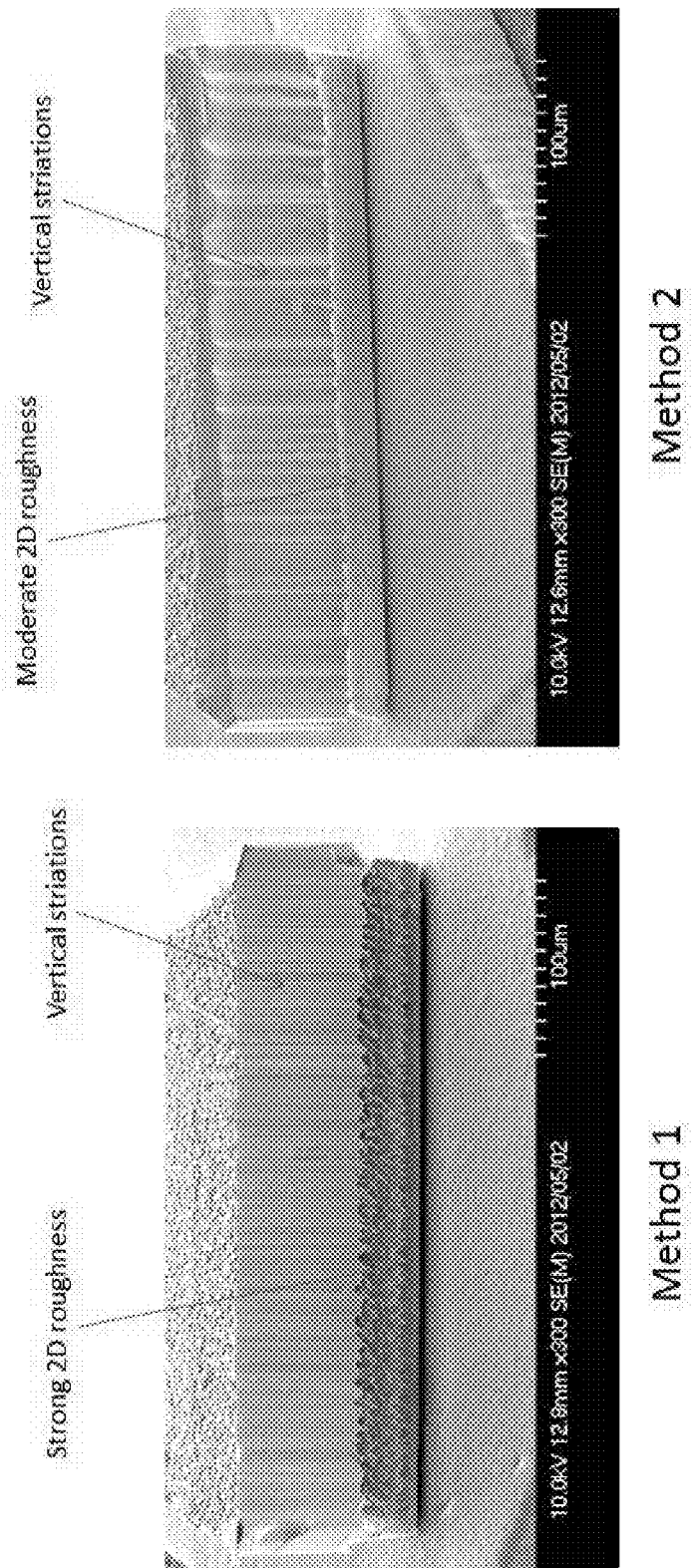
FIG. 22 depicts SEM images of LED chips formed by various laser scribing processes, according to some embodiments.

FIG. 22 compares SEM images of LED devices obtained by two singulation techniques. As an option, such techniques be implemented in the context of the architecture and functionality of the embodiments described herein.

The devices in FIG. 22 were singulated by using a laser scribing process followed by a breaking process. The two devices employed two methods. Each method uses a different laser profile during the laser scribing. Method 1 uses a multiple-beam profile; method 2 uses a single-beam profile. Due to the successive effect of the multiple beams as they are rastered along the scribing line, method 1 produces a strong 2-dimensional roughness in the laser-ablated region. Method 1, on the other hand, produces a moderate 2-dimensional roughness.

In general, the parameters of the laser scribing process (such as the beam profile, rastering. pulse width and power) may be optimized to enhance the roughness in the laser-ablated region.

Figure 23:
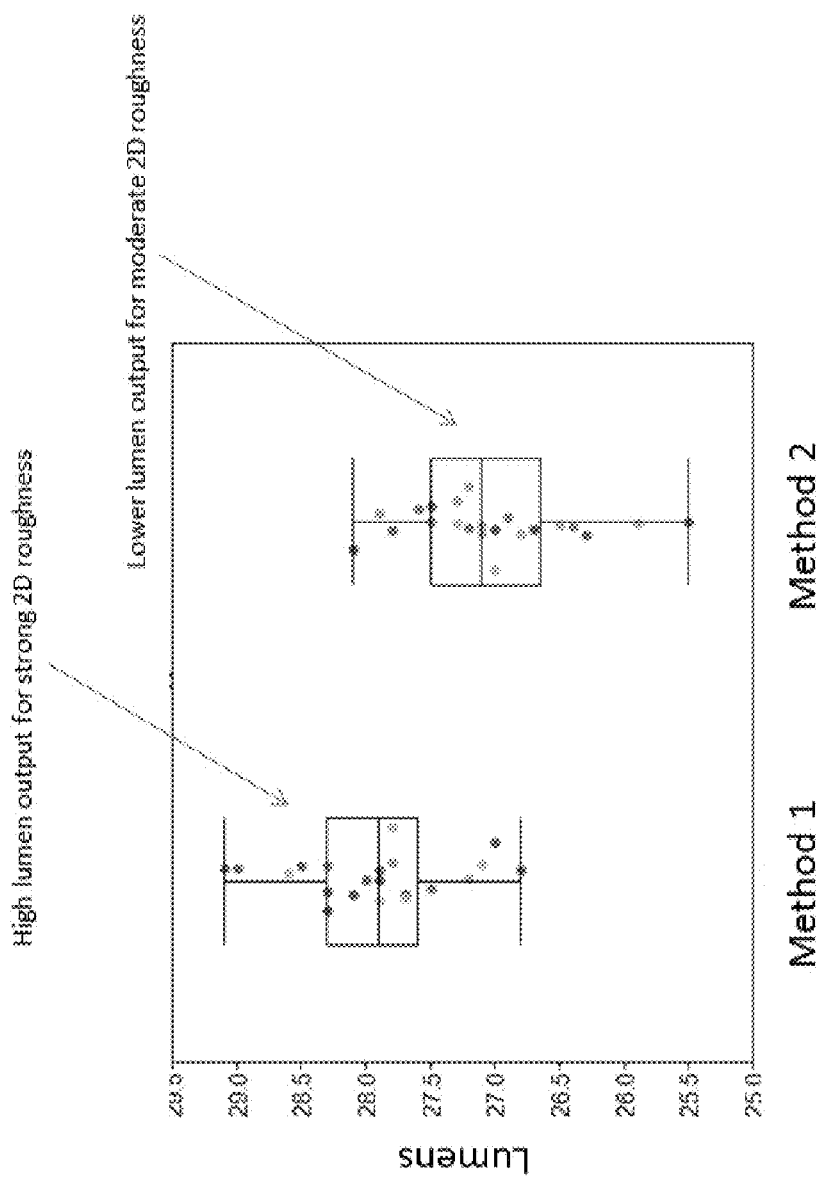
FIG. 23 shows the lumen output performance of LED chips formed by various laser scribing processes, according to some embodiments.

FIG. 23 compares the lumen output performance of white LEDs whose LED chips were obtained by two singulation techniques, as shown on FIG. 22. FIG. 23 shows that the LED produced by method 1 leads to a higher lumen output.

FIG. 24 is a sketch of the laser beam profile of a laser-ablation tool. Such a profile may be used for fabricating embodiments of the invention. FIG. 24 shows a laser beam profile composed of several (here, four) beams. This multiple-beam profile is rastered across the singulation direction. Thanks to the rastering, the same area of the semiconductor is illuminated several times by one of the beams. This can lead to a more pronounced roughness.

Some specifications according to some embodiments:
Vertical-to-horizontal chip aspect ratio >5%.
Average lateral size of rough features between 1 μm and 10 μm.
Average vertical size of rough features between 100 nm and 10 μm.
Average surface coverage of 2-dimensional rough features: top surface>0.5, sidewall>0.15.
A combination of sidewall and surface roughness, such that for any polar angle at least one of the surfaces has a one-bounce extraction efficiency into the outside medium larger than 10%.
Base shape of the LED can be a square, a triangle, a parallelogram.
The absorption coefficient of the Group III-nitride film is lower than 10 $cm^{-1}$. The embodiment of FIG. 18 describes the impact of absorption coefficient on extraction efficiency. Alternatively, some embodiments are characterized where the product of the typical chip dimension, and of the substrate coefficient, is smaller than 0.1 This can be understood to mean that the typical absorption through one light bounce in the chip will be less than 10%.

According to an embodiment, the present disclosure relates to a technique where the side roughness is formed by cleaving/sawing the chip.

According to an embodiment, the present disclosure relates to a technique where the side roughness is formed by chemical or PEC etching.

According to an embodiment, the present disclosure relates to a technique where the side roughness is formed by patterning and dry etching of the chip.

According to an embodiment, the present disclosure relates to a technique where the side roughness if formed by separation of the devices by laser ablation of the material in-between, followed by etching of the laser process by-products inducing a 2D roughness on the crystalline face of the device.

According to an embodiment, the present disclosure relates to a technique where the side roughness is formed by depositing a film (such as a dielectric) on the side of the LED and texturing it.

According to an embodiment, the present disclosure relates to a technique where slanted sidewalls are formed by laser scribing with multiple beams.

According to an embodiment, the present disclosure relates to a technique where a Group III-nitride layer is grown on a foreign substrate (and possibly separated from the foreign substrate) such that the vertical-to-horizontal aspect ratio of the Group III-nitride layer is at least 5%, and LEDs with top and sidewall roughness are formed.

According to an embodiment, the present disclosure relates to a technique where a layer of a Group III-nitride substrate is separated from the rest of the substrate such that the vertical-to-horizontal aspect ratio of the resulting Group III-nitride layer is at least 5%, and LEDs with top and sidewall roughness are formed.

In one embodiment, a plurality of light emitting diode devices is provided overlying a bulk-GaN containing substrate. Through suitable fabrication steps, a plurality of p-type metallic ohmic contacts is provided overlying the p-type GaN layer of the light emitting diode device structure, as part of the embodiment. Additionally, a plurality of n-type ohmic contacts is provided overlying the n-type GaN layer of the light emitting diode device structure, as part of the embodiment.

In an embodiment, the plurality of light emitting diode devices is singulated into individual chips using wafer sawing or dicing, where the wafer sawing or dicing induces a surface texture or roughness on the sidewalls of the singulated light emitting diode chips, where the surface texture or roughness has a characteristic pattern, pitch or shape which enhances the extraction of light from the light emitting diode chip. In one embodiment, a suitable wet chemical etching step may be applied after the wafer sawing or dicing step, so as to form a second texture or roughness characterizing the plurality of surfaces exposed to the wet etching step, where the second surface texture or roughness has a characteristic pattern, pitch or shape which enhances the extraction of light from the light emitting diode chip.

In another embodiment, the plurality of light emitting diode devices is singulated into individual chips using laser scribing followed by breaking, where the laser scribing induces a surface texture or roughness on the sidewalls of the singulated light emitting diode chips, where the surface texture or roughness has a characteristic pattern, pitch or shape which enhances the extraction of light from the light emitting diode chip. In an particular embodiment, a suitable wet chemical etching step may be applied between the laser scribing and breaking steps, in order to remove the slag formed as a result of the laser scribing, and this wet etching step may result in a second texture or roughness characterizing the plurality of surfaces exposed to the wet etching step, where the second surface texture or roughness has a characteristic pattern, pitch or shape which enhances the extraction of light from the light emitting diode chip.

In another embodiment, the plurality of light emitting diode devices are singulated into individual chips by fully ablating the substrate material between devices utilizing a laser. The laser ablation process induces a rough surface of slag and crystalline material on the side faces of the chips. The slag material can be etch away to prevent light absorption and retain only the roughness from the crystalline material. Alternatively, the slag itself can be used as a mask in conjunction with etching to imprint the roughness on the crystalline material followed by the removal of the slag material.

In another embodiment, the plurality of light emitting diode devices is singulated into individual chips using diamond scribing and breaking, where the diamond scribing and breaking step induces a surface texture or roughness on the sidewalls of the singulated light emitting diode chips, where the surface texture or roughness has a characteristic pattern, pitch or shape which enhances the extraction of light from the light emitting diode chip. In an embodiment, the diamond scribing and breaking may be performed along a direction or a plurality of directions which are substantially misaligned with respect to a crystalline direction or a plurality of crystalline directions of the GaN-containing substrate.

In another embodiment, the diamond scribing and breaking may be performed along a direction or plurality of directions which are substantially aligned with respect to a crystalline direction or plurality of crystalline directions of the GaN-containing substrate.

In yet another embodiment, the plurality of light emitting diode devices is singulated into individual chips using diamond scribing and breaking. In this embodiment, a suitable wet chemical etching step may be applied between the diamond scribing and breaking steps, so as to form a second texture or roughness characterizing the plurality of surfaces exposed to the wet etching step, where the second surface texture or roughness has a characteristic pattern, pitch or shape which enhances the extraction of light from the light emitting diode chip.

In an embodiment, the diamond scribing and breaking may be performed along a direction or a plurality of directions which are substantially misaligned with respect to a crystalline direction or a plurality of crystalline directions of the GaN-containing substrate. Alternatively, the diamond scribing and breaking may be performed along a direction or plurality of directions which are substantially aligned with respect to a crystalline direction or plurality of crystalline directions of the GaN-containing substrate. That is, the scribing is performed along at least one direction or a plurality of directions that are substantially misaligned with respect to a crystalline direction or a plurality of crystalline directions plane of the gallium and nitrogen containing substrate. In an embodiment, the direction is substantially misaligned is within +/−5 or +/−10 or +/−20 degrees of the plane of the gallium and nitrogen containing substrate. As used herein, the term misaligned is provided intentionally and is generally an off-set or the like. Depending upon the embodiment, the plane of the gallium and nitrogen containing substrate is one of a plurality of planes of the substrate material selected from a group consisting of at least c-plane, m-plane, or a-plane or others and their combinations, and semipolar planes. Again, there can be other variations, modifications, and alternatives.

In an embodiment, the characteristic texture or roughness may be substantially dissimilar across the plurality of surfaces formed as a result of the light emitting diode device singulation process. In yet another embodiment, the characteristic texture or roughness may be substantially similar across the plurality of surfaces formed as a result of the light emitting diode device singulation process.

In an embodiment, no specific means or methods are applied to apply a surface texture or roughness to the surface or plurality of surfaces of the light emitting diode device chip which are overlaid by the p-type metallic contact or n-type metallic contact or both. In another embodiment, means or methods are applied to apply a surface texture or roughness to the surface or plurality of surfaces of the light emitting diode device chip which are overlaid by the p-type metallic contact or n-type metallic contact or both.

The foregoing description of the exemplary embodiments has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A light emitting diode comprising:
   a gallium and nitrogen containing substrate comprising a surface region;
   an n-type epitaxial material overlying the surface region;
   one or more active regions overlying the n-type epitaxial material;
   a p-type epitaxial material overlying the one or more active regions;
   a first electrode coupled to the n-type epitaxial material, to the substrate, or to both the n-type epitaxial material and to the substrate;
   a second electrode coupled to the p-type epitaxial material;
   a top surface region comprising a top textured surface characterized by a top surface roughness of about 80 nm to about 10,000 nm;
   a base; and
   at least three lateral surface regions coupling the top surface region to the base, wherein at least one of the three lateral surface regions is characterized by a lateral surface roughness, wherein the at least one lateral surface region comprises a first portion and a second portion, wherein, the first portion comprise a one-dimensional surface roughness; and the second portion comprises a two-dimensional surface roughness.

2. The light emitting diode of claim 1, wherein,
   the top surface region is triangular;
   the base is triangular; and
   the at least three lateral surface regions comprise three lateral surface regions.

3. The light emitting diode of claim 1, wherein the light emitting diode has a thickness of at least 20 μm.

4. The light emitting diode of claim 1, wherein the lateral surface roughness ranges from 80 nm to about 1000 nm.

5. The light emitting diode of claim 1, wherein the lateral surface roughness ranges from about 1001 nm to about 10000 nm.

6. The light emitting diode of claim 1, wherein the top surface roughness is configured to extract a substantial portion of electromagnetic radiation derived from the one or more active regions.

7. The light emitting diode of claim 1, wherein the lateral surface roughness is configured to extract a substantial portion of electromagnetic radiation derived from the one or more active regions.

8. The light emitting diode of claim 1, wherein the one or more active regions comprises two or more of indium, gallium, aluminum, and nitrogen.

9. The light emitting diode of claim 1, wherein the at least one lateral surface region is configured in a non-polar orientation.

10. The device of claim 1, wherein the at least one lateral surface region is configured in a semi-polar orientation.

11. The device of claim 1, wherein the at least one lateral surface region is configured in a polar orientation.

12. The light emitting diode of claim 1, wherein the at least one lateral surface region is slanted with respect to the base.

13. The light emitting diode of claim 1, wherein the at least one lateral surface region is slanted at an angle from 5 degrees to 20 degrees with respect to the base.

14. The light emitting diode of claim 1, wherein the average lateral size of the one-dimensional surface roughness is from 1 μm to 10 μm.

15. The light emitting diode of claim 1, wherein the average vertical size of the one-dimensional surface roughness is between 100 nm and 10 μm.

16. The light emitting diode of claim 1, wherein the top surface roughness is characterized by a two-dimensional surface roughness.

17. The light emitting diode of claim 1, wherein the top surface roughness comprises greater than 15% of the area of the top surface region.

18. The light emitting diode of claim 1, wherein the one-dimensional surface roughness is characterized by vertical striations.

19. The light emitting diode of claim 1, wherein the one-dimensional surface roughness comprises vertical striations having a characteristic distance from 1 μm to 5 μm.

20. The light emitting diode of claim 1, wherein each of the at least three lateral surface regions comprises:
 a first portion comprising p-type gallium and nitrogen containing material characterized by a first surface roughness; and
 a second portion comprising an n-type gallium and nitrogen containing material characterized by a second surface roughness,
 wherein the first surface roughness is different than the second surface roughness.

21. The light emitting diode of claim 1, wherein the at least one lateral surface region is misaligned with a crystallographic plane of the gallium and nitrogen containing substrate.

22. The light emitting diode of claim 1, wherein the at least one lateral surface region is misaligned within +/−20 degrees with respect to a crystallographic plane of the gallium and nitrogen containing substrate.

23. The light emitting diode of claim 20, wherein,
 the first surface roughness is characterized by a two-dimensional surface roughness; and
 the second surface roughness is characterized by a one-dimensional surface roughness.

24. The light emitting diode of claim 23, wherein,
 the one-dimensional surface roughness comprises vertical striations.

25. A light emitting diode comprising:
 a gallium and nitrogen containing substrate comprising a surface region;
 an n-type epitaxial material overlying the surface region;
 one or more active regions overlying the n-type epitaxial material;
 a p-type epitaxial material overlying the one or more active regions;
 a first electrode coupled to the n-type epitaxial material, to the substrate, or to both the n-type epitaxial material and to the substrate;
 a second electrode coupled to the p-type epitaxial material;
 a triangular top surface region comprising a top textured surface;
 a triangular base; and
 three lateral surface regions coupling the top surface region to the base, wherein each of the at least three lateral surface regions comprises a first portion and a second portion, wherein, the first portion comprise a one-dimensional surface roughness; and the second portion comprises a two-dimensional surface roughness.

* * * * *